US012155176B2

(12) United States Patent
Noda et al.

(10) Patent No.: US 12,155,176 B2
(45) Date of Patent: Nov. 26, 2024

(54) TWO-DIMENSIONAL PHOTONIC-CRYSTAL SURFACE-EMITTING LASER

(71) Applicant: KYOTO UNIVERSITY, Kyoto (JP)

(72) Inventors: Susumu Noda, Kyoto (JP); Takuya Inoue, Osaka (JP); Masahiro Yoshida, Kyoto (JP); Menaka De Zoysa, Muko (JP)

(73) Assignee: KYOTO UNIVERSITY, Kyoto (JP)

( * ) Notice: Subject to any disclaimer, the term of this patent is extended or adjusted under 35 U.S.C. 154(b) by 705 days.

(21) Appl. No.: 17/430,852

(22) PCT Filed: Feb. 4, 2020

(86) PCT No.: PCT/JP2020/004174
§ 371 (c)(1),
(2) Date: Aug. 13, 2021

(87) PCT Pub. No.: WO2020/170805
PCT Pub. Date: Aug. 27, 2020

(65) Prior Publication Data
US 2022/0131343 A1  Apr. 28, 2022

(30) Foreign Application Priority Data
Feb. 22, 2019 (JP) ................... 2019-030277

(51) Int. Cl.
*H01S 5/11* (2021.01)
(52) U.S. Cl.
CPC ..................... *H01S 5/11* (2021.01)
(58) Field of Classification Search
CPC ................... H01S 5/11; H01S 5/185
See application file for complete search history.

(56) References Cited

U.S. PATENT DOCUMENTS

| 7,912,106 B2 * | 3/2011 | Baumann | H01S 5/187 372/99 |
| 2007/0121694 A1 * | 5/2007 | Okamoto | B82Y 20/00 372/50.124 |

(Continued)

FOREIGN PATENT DOCUMENTS

| DE | 112016003950 T5 | 5/2018 |
| JP | 2003-273456 A | 9/2003 |

(Continued)

OTHER PUBLICATIONS

Mar. 2, 2022 Extended European Search Report issued in Patent Application No. 20758933.4.

(Continued)

*Primary Examiner* — Michael Carter
(74) *Attorney, Agent, or Firm* — Oliff PLC

(57) ABSTRACT

A two-dimensional photonic-crystal surface-emitting laser includes an active layer; and a photonic-crystal layer including a two-dimensional photonic-crystal light-amplification portion that is a first two-dimensional photonic-crystal region provided in a plate-shaped base body disposed on one side of the active layer, and includes an amplification-portion photonic band gap which is a photonic band gap formed between two photonic bands having a band edge at a predetermined point in a reciprocal lattice space, and a two-dimensional photonic-crystal light-reflection portion that is a second two-dimensional photonic-crystal region provided around the two-dimensional photonic-crystal light-amplification portion, and includes a reflection-portion photonic band gap which is a photonic band gap formed between two photonic bands having a band edge at the predetermined point of the reciprocal lattice space, wherein energy ranges of the amplification-portion photonic band (Continued)

gap and the reflection-portion photonic band gap partially overlap and are different.

7 Claims, 16 Drawing Sheets

(56) References Cited

U.S. PATENT DOCUMENTS

| | | | |
|---|---|---|---|
| 2008/0240179 A1* | 10/2008 | Otsuka | H01S 5/185 372/26 |
| 2008/0285608 A1 | 11/2008 | Hori | |
| 2009/0135869 A1* | 5/2009 | Noda | H01S 5/11 438/22 |
| 2009/0147818 A1 | 6/2009 | Baumann et al. | |
| 2009/0285255 A1 | 11/2009 | Sakai et al. | |
| 2010/0315697 A1* | 12/2010 | Mahrt | H01S 5/11 359/320 |
| 2012/0269224 A1 | 10/2012 | Nagatomo et al. | |
| 2019/0157836 A1 | 5/2019 | Noda et al. | |

FOREIGN PATENT DOCUMENTS

| | | |
|---|---|---|
| JP | 2007-258262 A | 10/2007 |
| JP | 2008-243962 A | 10/2008 |
| JP | 2008-311625 A | 12/2008 |

OTHER PUBLICATIONS

Apr. 7, 2020 Search Report issued in International Patent Application No. PCT/JP2020/004174.
Aug. 10, 2021 International Preliminary Report on Patentability issued in International Patent Application No. PCT/JP2020/004174.
Jan. 17, 2023 Office Action issued in Japanese Patent Application No. 2019-030277.
Xiaochen Ge et al., "Low index contrast heterostructure photonic crystal cavities with high quality factors and vertical radiation coupling", Applied Physics Letters 112, 141105 (2018), pp. 141105-1-141105-4.

* cited by examiner

<EXAMPLE 3>

<COMPARATIVE EXAMPLE>

TWO-DIMENSIONAL PHOTONIC-CRYSTAL SURFACE-EMITTING LASER

TECHNICAL FIELD

The present invention relates to a two-dimensional photonic-crystal surface-emitting laser in which a two-dimensional photonic crystal is used for amplifying light.

BACKGROUND ART

A two-dimensional photonic-crystal surface-emitting laser includes an active layer and a plate-shaped photonic-crystal layer. The photonic-crystal layer has a configuration in which modified refractive-index regions having a refractive index different from that of a plate-shaped base body are periodically and two-dimensionally arranged in the plate-shaped base body. A typical modified refractive-index region is a hole formed in the base body. In the two-dimensional photonic-crystal surface-emitting laser, only light having a predetermined wavelength corresponding to the period of the modified refractive-index region among light generated in the active layer by supplying an electric current into the active layer is amplified and laser-oscillated, and emitted as a laser beam in a direction perpendicular to the photonic-crystal layer. Here, when the predetermined wavelength is a wavelength corresponding to the energy of the upper limit or the lower limit (hereinafter, both the upper limit and the lower limit are referred to as "band edge") in an energy band (which is referred to as "photonic band" and is abbreviated as "PB". Typically, there are multiple energy bands) formed by the two-dimensional photonic crystal having a periodic refractive index distribution, a group velocity of light becomes 0 and a standing wave is formed, so that stable laser oscillation can be obtained (refer to Patent Literature 1).

Patent Literature 1 and Patent Literature 2 disclose a two-dimensional photonic-crystal surface-emitting laser including a reflection portion that reflects light amplified in a "two-dimensional photonic-crystal region" on an outer periphery of the region, the two-dimensional photonic-crystal region" being a region in which modified refractive-index regions are periodically and two-dimensionally arranged in a plate-shaped base body in a photonic-crystal layer. With this, it is possible to prevent light from leaking in a direction parallel to the photonic-crystal layer and to increase the intensity of a laser beam emitted in a direction perpendicular to the photonic-crystal layer. The reflection portion includes, for example, a groove provided on the surface of the base body and surrounding the two-dimensional photonic-crystal region, or a diffraction grating including a plurality of grooves provided at intervals of half the period of the modified refractive-index regions and surrounding the two-dimensional photonic-crystal region.

CITATION LIST

Patent Literature

Patent Literature 1: JP 2007-258262 A
Patent Literature 2: JP 2003-273456 A

SUMMARY OF INVENTION

Technical Problem

The holes in the two-dimensional photonic-crystal region and the groove formed as the reflection portion are usually prepared by etching the base body. However, since the holes and the groove have different planar shapes and depths, the etching time for forming them is different. Therefore, the two-dimensional photonic crystal and the reflection portion cannot be manufactured by one-time etching, and it takes extra process and time to manufacture the two-dimensional photonic-crystal surface-emitting laser having the reflection portion.

In addition, depending on the purpose of use, a two-dimensional photonic-crystal surface-emitting laser in which a laser beam is emitted from a wide area is required. When the area of the two-dimensional photonic-crystal region is accordingly increased while light is confined in the two-dimensional photonic-crystal region by the reflection portion, in addition to the standing wave of a fundamental mode in which an antinode of the electric field exists in the vicinity of the center of the two-dimensional photonic-crystal region, a standing wave of a higher mode in which the antinode of the electric field exists in the vicinity of the end of the two-dimensional photonic-crystal region is easily formed in the two-dimensional photonic crystal, and laser oscillation becomes unstable.

The problem to be solved by the present invention is to provide a two-dimensional photonic-crystal surface-emitting laser capable of reducing process and time required for manufacturing, and capable of emitting a stable laser beam with strong intensity regardless of the size of a light emitting area by controlling the degree of light confinement.

Solution to Problem

In order to solve the above problems, the present invention provides a two-dimensional photonic-crystal surface-emitting laser including a) an active layer; and
b) a photonic-crystal layer including
  b-1) a two-dimensional photonic-crystal light-amplification portion that is a first two-dimensional photonic-crystal region provided in a plate-shaped base body disposed on one side of the active layer, and includes an amplification-portion photonic band gap which is a photonic band gap formed between two photonic bands having a band edge at a predetermined point in a reciprocal lattice space, and
  b-2) a two-dimensional photonic-crystal light-reflection portion that is a second two-dimensional photonic-crystal region provided around the two-dimensional photonic-crystal light-amplification portion, and includes a reflection-portion photonic band gap which is a photonic band gap formed between two photonic bands having a band edge at the predetermined point of the reciprocal lattice space,
wherein energy ranges of the amplification-portion photonic band gap and the reflection-portion photonic band gap partially overlap and are different.

Both the two-dimensional photonic-crystal light-amplification portion (which is referred to as "2DPC light-amplification portion") and the two-dimensional photonic-crystal light-reflection portion ("2DPC light-reflection portion") have a configuration similar to that of a normal two-dimensional photonic crystal, that is, a configuration in which modified refractive-index regions having a refractive index different from that of a plate-shaped base body are periodically and two-dimensionally arranged in the plate-shaped base body. The 2DPC light-amplification portion corresponds to the above-described two-dimensional photonic-crystal region. In the two-dimensional photonic-crystal surface-emitting laser according to the present invention, similarly to the two-dimensional photonic-crystal surface-emitting laser in the related art, among the light generated by supplying an electric current into the active layer, light having a wavelength ("oscillation wavelength") corresponding to the energy of the band edge of the 2DPC light-amplification portion is laser-oscillated.

Generally, in a two-dimensional photonic crystal, a plurality of PB are formed, and a photonic band gap (PBG) in which light cannot exist is formed in a specific energy range between two PBs adjacent in terms of energy. The lower end of the energy of a PBG is also the band edge of the PB immediately below the PBG, and the upper end of the energy of the PBG is also the band edge of another PB immediately above the PBG. In the two-dimensional photonic-crystal surface-emitting laser according to the present invention, the energy ranges of the amplification-portion photonic band gap ("amplification portion PBG") and the reflection-portion photonic band gap ("reflection portion PBG") partially overlap and are different. As a result, there are any one or a plurality of states in which (i) the energy of the band edge on the lower end side of the amplification portion PBG is in the reflection portion PBG, (ii) the energy of the band edge on the lower end side is in the reflection portion PB, (iii) the energy of the band edge on the upper end side is on the reflection portion PBG side, and (iv) the energy of the band edge on the upper end side is in the reflection portion PB.

At the band edge of the 2DPC light-amplification portion where the energy is in the reflection portion PBG, the light having an oscillation wavelength corresponding to the energy at the band edge cannot propagate in the 2DPC light-reflection portion. Therefore, this light is reflected on the 2DPC light-amplification portion by the 2DPC light-reflection portion. As a result, the intensity of the laser beam emitted in the direction perpendicular to the two-dimensional photonic crystal can be increased. Such a configuration is particularly advantageous when it is desired to reduce the area for emitting the laser beam.

At the band edge of the 2DPC light-amplification portion where the energy is in the reflection portion PB, the light having an oscillation wavelength corresponding to the energy at the band edge can propagate in the 2DPC light-reflection portion. However, a part thereof is reflected at the boundary with the base body in each of the plurality of modified refractive-index regions in the 2DPC light-reflection portion due to the difference in refractive index between the base body and the modified refractive-index region. Therefore, the light having the oscillation wavelength is gently reflected to the 2DPC light-amplification portion side while spreading in the 2DPC light-reflection portion. As a result, in a case where the 2DPC light-amplification portion is large, a standing wave in a higher mode in which an antinode of an electric field exists in the vicinity of an end of the 2DPC light-amplification portion is less likely to occur, and a stable laser beam can be emitted from a wide area in the 2DPC light-amplification portion. The intensity of reflection generated in this case becomes weaker as the oscillation wavelength becomes farther from the wavelength corresponding to the band edge of the reflection portion PB. Therefore, the degree of light confinement can be continuously controlled by adjusting the wavelength difference between the oscillation wavelength and the wavelength corresponding to the band edge of the reflection portion PB.

As described above, in the two-dimensional photonic-crystal surface-emitting laser according to the present invention, it is possible to emit a stable laser beam with strong intensity regardless of the size of a light emitting area by adjusting the intensity of light confinement.

In addition, according to the two-dimensional photonic-crystal surface-emitting laser of the present invention, the 2DPC light-reflection portion has a common configuration in which the modified refractive-index regions are periodically arranged in the plate-shaped base body, similarly to the 2DPC light-amplification portion. Furthermore, in the 2DPC light-reflection portion and the 2DPC light-amplification portion, since the energy ranges of the amplification portion PBG and the reflection portion PBG partially overlap at the same point in the reciprocal lattice space, it is possible to set such that the periodic structures of the amplification portion PBG and the reflection portion PBG are relatively close to each other. For these reasons, since the 2DPC light-reflection portion and the 2DPC light-amplification portion can be simultaneously manufactured by a similar method, it is possible to reduce process required for manufacturing the two-dimensional photonic-crystal surface-emitting laser.

In order to make the energy ranges of the amplification portion PBG and the reflection portion PBG partially overlap and different, the 2DPC light-amplification portion and the 2DPC light-reflection portion can have, for example, the following configurations.

As Example 1, there is a configuration in which the ratio (which is referred to as "filling factor" and is abbreviated as "FF") of the volume occupied by the modified refractive-index region in the 2DPC light-amplification portion is different from the FF of the 2DPC light-reflection portion. As a result, the effective refractive index of the light is different between the 2DPC light-amplification portion and the 2DPC light-reflection portion, and thus, the energy ranges of PBGs of both the 2DPC light-amplification portion and the 2DPC light-reflection portion are also different from each other. Specifically, the smaller the FF, the lower the energy range of the PBG. In the case where the reflection portion PBG is closer to lower energy than the amplification portion PBG, the energy of the lower band edge of the amplification portion PBG is in the reflection portion PBG, and the energy of the upper band edge of the amplification portion PBG is in the reflection portion PB. In the case where the reflection portion PBG is closer to higher energy than the amplification portion PBG, the energy of the lower band edge of the amplification portion PBG is in the reflection portion PB, and the energy of the upper band edge of the amplification portion PBG is in the reflection portion PBG.

As Example 2, there is a configuration in which the period length in which the modified refractive-index regions are arranged in the 2DPC light-amplification portion is different from the period length in which the modified refractive-index regions are arranged in the 2DPC light-reflection portion. Specifically, the larger the period length, the lower the energy range of the PBG. The relationship between the lower and upper band edges of the amplification portion PBG and the reflection portion PBG and the reflection portion PB in the case where the reflection portion PBG is closer to lower energy than the amplification portion PBG or where the reflection portion PBG is closer to higher energy than the amplification portion PBG is similar to that in the case of Example 1.

As Example 3, it is possible to take a configuration in which the modified refractive-index regions are arranged with a first predetermined period length in the 2DPC light-amplification portion, and in the 2DPC light-reflection portion, main modified refractive-index regions are arranged with a second predetermined period length and sub-modified refractive-index regions having a volume smaller than that of the main modified refractive-index regions are arranged between the two most adjacent main modified refractive-index regions. As a result, the centers of the energy ranges of the reflection portion PBG and the amplification portion PBG are substantially the same, and the energy range of the reflection portion PBG becomes larger than the energy range of the amplification portion PBG. Therefore, both the energy of the lower and upper band edges of the amplification portion PBG are in the reflection portion PBG.

It is also possible to take a configuration in which the modified refractive-index regions are arranged with a first predetermined period length in the 2DPC light-reflection portion, and in the 2DPC light-amplification portion, main modified refractive-index regions are arranged with a second predetermined period length and sub-modified refractive-index regions having a volume smaller than that of the main modified refractive-index regions are arranged between the two most adjacent main modified refractive-index regions. As a result, the centers of the energy ranges of the reflection portion PBG and the amplification portion PBG are substantially the same, and the energy range of the reflection portion PBG becomes smaller than the energy range of the amplification portion PBG. Therefore, both the energy of the lower and upper band edges of the amplification portion PBG are outside the reflection portion PBG (inside the reflection portion PB).

The effect of the present invention is exhibited even when the 2DPC light-reflection portion is provided only in a part of the periphery of the 2DPC light-amplification portion, but the 2DPC light-reflection portion is preferably provided in the entire periphery of the 2DPC light-amplification portion in order to exhibit a higher effect.

The 2DPC light-amplification portion is desirably included in a light-introduction region in which light emitted in the active layer is introduced into the photonic-crystal layer. As a result, light emitted from the active layer can be supplied to the entire 2DPC light-amplification portion, and the 2DPC light-amplification portion can be operated for light amplification without waste. The light-introduction region has substantially the same position, shape, and size as a region (electric current supply region) in which an electric current is supplied into the active layer in a plane parallel to the active layer and the photonic-crystal layer. The electric current supply region is determined by the shape of an electrode that supplies an electric current into the active layer.

It is desirable that each of the modified refractive-index regions arranged in the 2DPC light-amplification portion has a non-circular planar shape. As a result, the light amplified in the 2DPC light-amplification portion is easily emitted in a direction perpendicular to the two-dimensional photonic crystal. The non-circular modified refractive-index region includes a combination of two or more circular (or non-circular) regions having a refractive index different from that of the base body.

Advantageous Effects of Invention

According to the two-dimensional photonic-crystal surface-emitting laser of the present invention, it is possible to reduce process required for manufacturing, and it is possible to emit a stable laser beam with strong intensity regardless of the size of a light emitting area by controlling the degree of light confinement.

DESCRIPTION OF EMBODIMENTS

Embodiments of a two-dimensional photonic-crystal surface-emitting laser according to the present invention will be described with reference to FIGS. 1 to 28.

Figure 1:
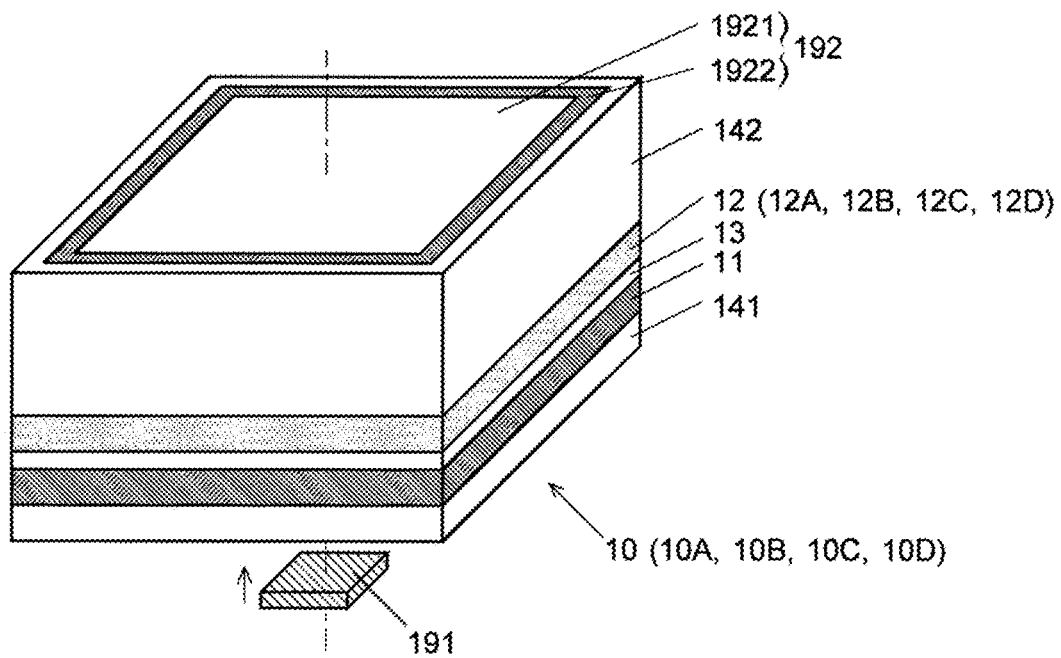
FIG. 1 is a perspective view illustrating a first embodiment of a two-dimensional photonic-crystal surface-emitting laser according to the present invention.
Figure 2:
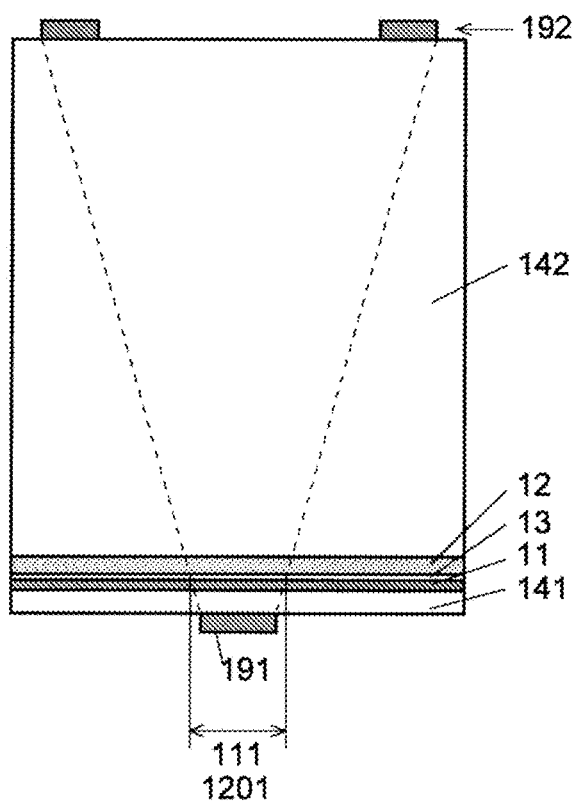
FIG. 2 is a cross-sectional view illustrating an electric current supply region in the two-dimensional photonic-crystal surface-emitting laser of the first embodiment.

(1) First Embodiment (1-1) Configuration of Two-Dimensional Photonic-Crystal Surface-Emitting Laser of First Embodiment As illustrated in FIG. 1, a two-dimensional photonic-crystal surface-emitting laser 10 of the first embodiment has a configuration in which a first electrode 191, a first cladding layer 141, an active layer 11, a spacer layer 13, a photonic-crystal layer 12, a second cladding layer 142, and a second electrode 192 are sequentially stacked in the above-described order. However, the order of the active layer 11 and the photonic-crystal layer 12 may be opposite to that described above. In FIG. 1, for convenience, the first electrode 191 is illustrated as a lower side, and the second electrode 192 is illustrated as an upper side, but the orientation of the two-dimensional photonic-crystal surface-emitting laser 10 at the time of use is not limited to that illustrated in FIG. 1. In FIG. 1, the first electrode 191 is separated from other components, but is actually in contact with the lower surface of the first cladding layer 141.

Hereinafter, the configurations of the layers and the electrodes will be described. First, configurations other than the photonic-crystal layer 12 will be described, and then the configuration of the photonic-crystal layer 12 will be described in detail. It should be noted that the configuration other than the photonic-crystal layer 12 is the same in the embodiments other than the first embodiment.

The active layer 11 emits light within a specific wavelength band upon receiving electric charges supplied from the first electrode 191 and the second electrode 192. The material of the active layer 11 is an InGaAs/AlGaAs multiple quantum well (emission wavelength band: 935 to 945 nm) in the present embodiment, but is not limited to this material in the present invention.

The spacer layer 13 is not an essential component in the present invention, but is provided to connect the active layer 11 and the photonic-crystal layer 12 of different materials. The material of the spacer layer 13 is AlGaAs in the present embodiment, but is appropriately changed according to the materials of the active layer 11 and the photonic-crystal layer 12.

The first cladding layer 141 and the second cladding layer 142 connect the first electrode 191 to the active layer 11, and the second electrode 192 to the photonic-crystal layer 12 respectively, facilitate supplying an electric current from the first electrode 191 and the second electrode 192 into the active layer 11, and confine light in the vicinity of the active layer 11 due to a difference in the refractive index from the active layer 11. To this end, a p-type semiconductor having a refractive index lower than that of the active layer 11 is used as a material of the first cladding layer 141, and an n-type semiconductor having a refractive index lower than that of the active layer 11 is used as a material of the second cladding layer 142. The first cladding layer 141 has a two-layer structure of a layer made of p-GaAs and a layer made of p-AlGaAs in order from the first electrode 191 side, and similarly, the second cladding layer 142 has a two-layer structure of a layer made of n-GaAs and a layer made of n-AlGaAs in order from the second electrode 192 side (a two-layer structure is not illustrated in either case). Also in the first cladding layer 141 and the second cladding layer 142, the present invention is not limited to the above materials. The planar dimensions of the first cladding layer 141 and the second cladding layer 142 are the same as those of the base body 121 of the active layer 11 and the photonic-crystal layer 12. For the reason described in the following description of the first electrode 191, the thickness of the second cladding layer 142 is sufficiently larger than the thicknesses of the active layer 11, the photonic-crystal layer 12, the spacer layer 13, and the first cladding layer 141.

The first electrode 191 has a square shape and is smaller than the active layer 11. When the thickness of the second cladding layer 142 is sufficiently larger than the thickness of the first cladding layer 141 as described above, as illustrated in FIG. 2, the shape and size of the electric current supply region 111 into which the electric current is supplied in the active layer 11 are substantially equal to those of the first electrode 191 (slightly larger than the first electrode 191). The shape and size of the electric current supply region 111 can be adjusted by those of the first electrode 191. A reflection layer (not illustrated) made of metal opaque to laser light is provided around the first electrode 191 via an insulator between the reflection layer and the first electrode 191. The reflection layer reflects the laser light generated inside the two-dimensional photonic-crystal surface-emitting laser 10 together with the first electrode 191 and emits the laser light from the second electrode 192 side to the outside. The shape of the first electrode 191 is not limited to a square shape, and may be another shape such as a circular shape.

The second electrode 192 has a configuration in which the center of a square plate-shaped member made of metal opaque to laser light is hollowed out in a square shape. A portion where the plate-shaped member is hollowed out is referred to as a window portion 1921, and a portion where the plate-shaped member is left is referred to as a frame portion 1922. The plate-shaped member has one side longer than that of the first electrode 191. The shape of the second electrode 192 is not limited to a square shape, and may be another shape such as a circular shape. As the second electrode 192, instead of having such a window portion, a plate-shaped electrode made of a conductive material (for example, indium tin oxide) transparent to the laser light may be used.

Figure 3:
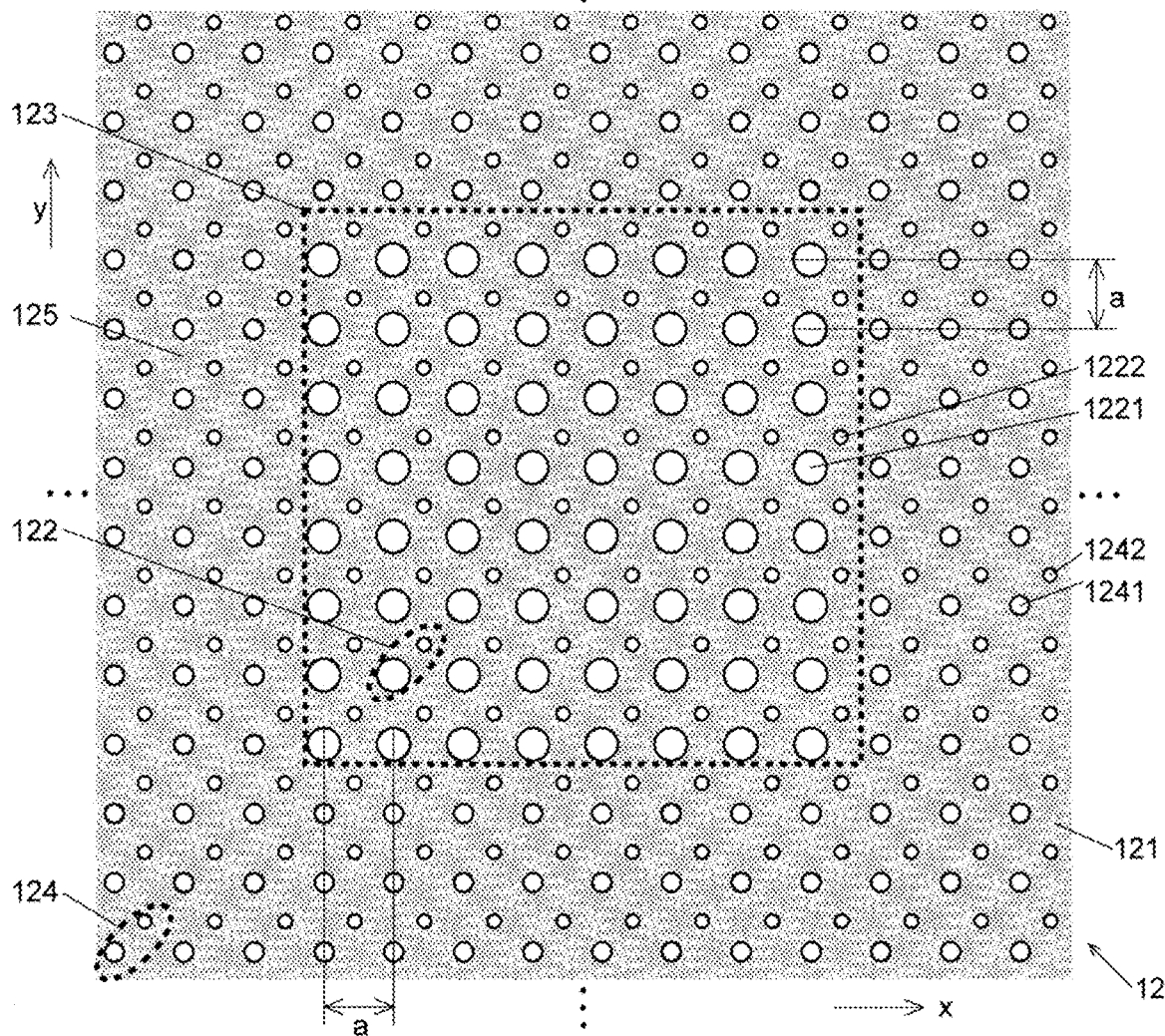
FIG. 3 is a plan view illustrating a configuration of a photonic-crystal layer in the two-dimensional photonic-crystal surface-emitting laser of the first embodiment.

As illustrated in FIG. 3, the photonic-crystal layer 12 includes a plate-shaped base body 121, first modified refractive-index regions 122 arranged in a square lattice pattern (periodically two-dimensionally) in a square region in the vicinity of the center of the base body 121, and second modified refractive-index regions 124 arranged in a square lattice pattern (periodically two-dimensionally) outside the square region. The inside of the square region corresponds to the 2DPC light-amplification portion 123, and the region where the second modified refractive-index regions 124 are arranged outside the square region corresponds to the 2DPC light-reflection portion 125. In both the 2DPC light-amplification portion 123 and the 2DPC light-reflection portion 125, the period length of the square lattice is the same (designated as "a").

As described above, since the thickness of the second cladding layer 142 is sufficiently larger than the thicknesses of the active layer 11, the photonic-crystal layer 12, and the spacer layer 13, the light-introduction region 1201 of the photonic-crystal layer 12 into which light is introduced from the active layer 11 is substantially the same region as the electric current supply region 111 in a plane parallel to the active layer 11 and the photonic-crystal layer 12. The range of the 2DPC light-amplification portion 123 is preferably included in the light-introduction region 1201 (same as light-introduction region 1201 or narrower than light-introduction region 1201). As a result, the light emitted from the active layer 11 can be supplied to the entire 2DPC light-amplification portion 123 as described later, and the 2DPC light-amplification portion 123 can be operated for the light amplification without waste.

The first modified refractive-index region 122 includes a first main modified refractive-index region 1221 and a first sub-modified refractive-index region 1222. The first main modified refractive-index region 1221 and the first sub-modified refractive-index region 1222 are independent of each other (not in contact with each other), but combinations thereof are periodically arranged (in a square lattice shape with the period length a) to function as one first modified refractive-index region 122. The first main modified refractive-index region 1221 has a large area (which is hereinafter referred to as "area") and the same thickness in plan view as compared with the first sub-modified refractive-index region 1222, and thus has a larger volume. In the first embodiment, both the first main modified refractive-index region 1221 and the first sub-modified refractive-index region 1222 are formed of holes. Instead of the holes, a member having a refractive index different from that of the base body 121 may be embedded.

Similarly to the first modified refractive-index region 122, the second modified refractive-index region 124 also includes a second main modified refractive-index region 1241 and a second sub-modified refractive-index region 1242 which are independent of (not in contact with) each other. The volume of the second main modified refractive-index region 1241 is larger than that of the second sub-modified refractive-index region 1242 (the area is large and the thickness is the same). In addition, the volume of the second main modified refractive-index region 1241 is smaller than that of the first main modified refractive-index region 1221 (the area is small and the thickness is the same). The second sub-modified refractive-index region 1242 and the first sub-modified refractive-index region 1222 have the same volume (area and thickness). Therefore, the ratio of the volume occupied by the second modified refractive-index region 124 in the 2DPC light-reflection portion 125 (FF of the second modified refractive-index region 124) is smaller than the ratio of the volume occupied by the first modified refractive-index region 122 in the 2DPC light-amplification portion 123 (FF of the first modified refractive-index region 122).

In FIG. 3, only eight first modified refractive-index regions 122 are illustrated in each of the lateral direction (which is hereinafter referred to as "x direction") and the longitudinal direction (which is hereinafter referred to as "y direction") of the square lattice, but the number of first modified refractive-index regions 122 is not limited thereto. In addition, in FIG. 3, only the vicinity of the 2DPC light-amplification portion 123 is illustrated for simplification, and actually, the 2DPC light-reflection portion 125 is provided to extend to the outside of the range illustrated in FIG. 3.

Figure 4:
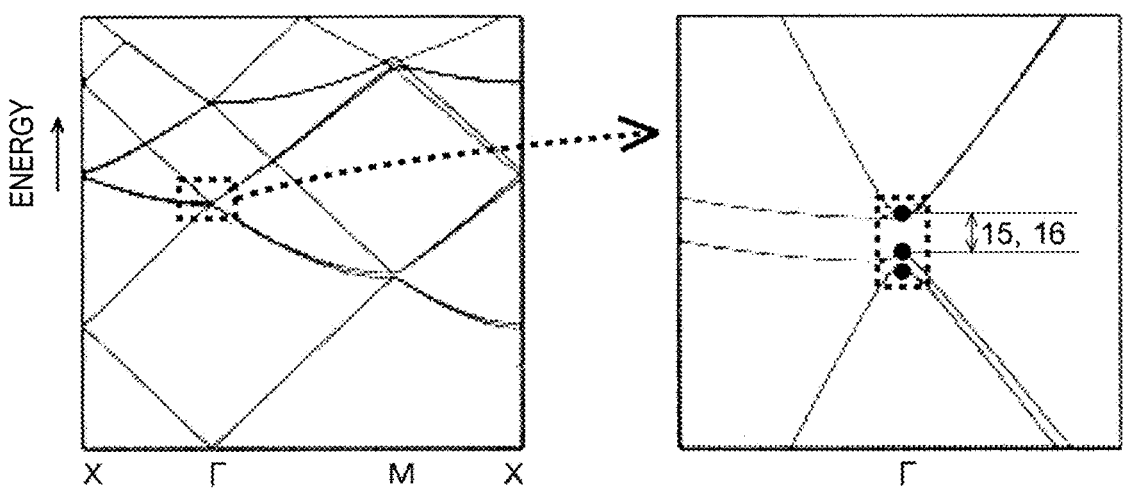
FIG. 4 is a band diagram (left diagram) and a partially enlarged diagram (right diagram) thereof in a two-dimensional photonic crystal having a square lattice periodic structure.

As described above, in the 2DPC light-amplification portion 123 and the 2DPC light-reflection portion 125 in which the modified refractive-index regions are arranged in a square lattice shape with the same period length, FF of the second modified refractive-index region 124 is smaller than FF of the first modified refractive-index region 122, so that the amplification portion PBG 15 and the reflection portion PBG 16 are formed as follows. In the 2DPC light-amplification portion 123, the amplification portion PBG 15 is formed between two PBs having a band edge at a point called a point F (corresponding to the origin of the reciprocal lattice space) in the reciprocal lattice space (FIG. 4). In the 2DPC light-reflection portion 125, the reflection portion PBG 16 having substantially the same energy width as the amplification portion PBG 15 is formed between the two PBs having the band edge at the point F with lower energy than the amplification portion PBG 15. When the difference between the FFs of the first modified refractive-index region 122 and the second modified refractive-index region 124 is within a certain range, the energy ranges of the amplification portion PBG 15 and the reflection portion PBG 16 partially overlap (overlap range 17 in FIG. 5) and are different. The lower band edge 181 of the amplification portion PBG 15 has energy in the reflection portion PBG 16. In the upper band edge 182 of the amplification portion PBG 15, the energy is outside the reflection portion PBG 16 (in the reflection portion PB).

(1-2) Operation of Two-Dimensional Photonic-Crystal Surface-Emitting Laser of First Embodiment An operation of the two-dimensional photonic-crystal surface-emitting laser 10 of the first embodiment will be described.

By applying a predetermined voltage between the first electrode 191 and the second electrode 192, an electric current is supplied into the active layer 11 from both electrodes. Since the area of the second electrode 192 is larger than that of the first electrode 191, in the active layer 11, an electric current (charge) is intensively supplied in a range (electric current supply range) narrower than the second electrode 192 and wider than the first electrode 191. As a result, light within a specific wavelength band is emitted from the electric current supply region 111 of the active layer 11.

In the light emission thus generated, light having a wavelength (oscillation wavelength) corresponding to the period length a of the square lattice is selectively amplified in the 2DPC light-amplification portion 123 of the photonic-crystal layer 12. This oscillation wavelength is a wavelength corresponding to the energy of the band edge 181 at the point F in the reciprocal lattice space of the square lattice. Since the energy of the band edge 181 is in the reflection portion PBG 16, the light having this oscillation wavelength cannot exist in the 2DPC light-reflection portion 125. Therefore, the light amplified by the 2DPC light-amplification portion 123 is further amplified because the light is reflected on the 2DPC light-amplification portion 123 by the 2DPC light-reflection portion 125. The light thus amplified by the 2DPC light-amplification portion 123 is diffracted in a direction perpendicular to the photonic-crystal layer 12 and emitted from a window portion 1921 of the second electrode 192 as a laser beam.

According to the two-dimensional photonic-crystal surface-emitting laser 10 of the first embodiment, the light having the oscillation wavelength is reflected on the 2DPC light-amplification portion 123 by the 2DPC light-reflection portion 125 and further amplified, so that the intensity of the laser beam can be increased. The configuration of the two-dimensional photonic-crystal surface-emitting laser 10 is useful when it is desired to reduce the area from which the laser beam is emitted.

Generally, in a two-dimensional photonic-crystal surface-emitting laser, in a case where the planar shape of the modified refractive-index region of the two-dimensional photonic crystal that amplifies light is circular, the symmetry of the planar shape is high, so that the electric fields generated in the two-dimensional photonic-crystal cancel each other out, and the laser beam exhibits a donut-shaped intensity distribution with low intensity in the vicinity of the center of the cross section. On the other hand, in the present embodiment, since the planar shape of the first modified refractive-index region 122 is lower in symmetry than the circular shape, it is possible to prevent the intensity from weakening in the vicinity of the center of the cross section of the laser beam and to obtain a laser beam having high uniformity of the intensity in the cross section.

The two-dimensional photonic-crystal surface-emitting laser 10 of the first embodiment has a common configuration in which the 2DPC light-amplification portion 123 and the 2DPC light-reflection portion 125 have modified refractive-index regions (the first modified refractive-index region 122 and the second modified refractive-index region 124) periodically arranged in the plate-shaped base body 121. In addition, in the two-dimensional photonic-crystal surface-emitting laser 10, the FFs of the first modified refractive-index region and the second modified refractive-index region are set such that the 2DPC light-amplification portion 123 and the 2DPC light-reflection portion 125 have PBG partially overlapping at the point F in the reciprocal lattice space, and thereby the FFs of the first modified refractive-index region 122 and the second modified refractive-index region 124 have close values. For these reasons, the 2DPC light-amplification portion 123 and the 2DPC light-reflection portion 125 have a close configuration, and thus, for example, by forming the first modified refractive-index region 122 and the second modified refractive-index region 124 simultaneously by applying a resist mask to the base body 121 and then performing etching with a gas, the 2DPC light-amplification portion 123 and the 2DPC light-reflection portion 125 can be simultaneously manufactured by the same method. Therefore, it is possible to reduce process required for manufacturing the two-dimensional photonic-crystal surface-emitting laser.

(1-3) Simulation of Characteristics of Two-Dimensional Photonic-Crystal Surface-Emitting Laser of First Embodiment With respect to the two-dimensional photonic-crystal surface-emitting laser 10 of the first embodiment, a result of obtaining characteristics by calculation will be described. In this calculation, 80 modified refractive-index regions are arranged in the x direction and 80 modified refractive-index regions are arranged in the y direction in the photonic-crystal layer 12, and among the modified refractive-index regions, 20 modified refractive-index regions are arranged in the longitudinal direction and 20 modified refractive-index regions are arranged in the lateral direction in the vicinity of the center, and these modified refractive-index regions are set as the first modified refractive-index region 122, and the other modified refractive-index regions are set as the second modified refractive-index region 124. The lattice constant a of the square lattice was 280 nm. The position of the first sub-modified refractive-index region 1222 was shifted from the first main modified refractive-index region 1221 by 0.44a in the x direction and 0.44a in the y direction. As described above, by arranging the first sub-modified refractive-index region 1222 at a position shifted from the first main modified refractive-index region 1221 by 0.35a to 0.5a in the x direction and by 0.35a to 0.5a in the y direction, the feedback effect of the light amplified in the photonic-crystal layer 12 is enhanced. Similarly, the position of the second sub-modified refractive-index region 1242 was shifted from the second main modified refractive-index region 1241 by 0.44a in the x direction and 0.44a in the y direction. FF is 0.09 (9%) in the first main modified refractive-index region 1221, 0.03 (3%) in the first sub-modified refractive-index region 1222, 0.06 (6%) in the second main modified refractive-index region 1241, and 0.03 (3%) in the second sub-modified refractive-index region 1242. Therefore, FF of the first modified refractive-index region 122 is 0.12 (12%), and FF of the second modified refractive-index region 124 is 0.09 (9%). The thickness of the photonic-crystal layer 12 was 170 nm, and the distance between the photonic-crystal layer 12 and the active layer 11 was 60 nm. The two-dimensional photonic-crystal surface-emitting laser 10 of the first embodiment having the above parameters is referred to as "Example 1".

In the two-dimensional photonic-crystal surface-emitting laser of Example 1, the effective refractive indexes of the 2DPC light-amplification portion 123 and the 2DPC light-reflection portion 125, and the energy ranges of the amplification portion PBG 15 and the reflection portion PBG 16 were calculated. As a result, the effective refractive index of the 2DPC light-amplification portion 123 was 3.372, and the effective refractive index of the effective refractive index of the 2DPC light-reflection portion 125 was 3.388. In addition, the energy range of the amplification portion PBG 15 was 931 to 951 nm in terms of a wavelength in vacuum, and the energy range of the reflection portion PBG 16 was 935 to 957 nm in terms of the same. From this calculation result, it can be seen that the energy (upper side in wavelength conversion, that is, 951 nm) of the band edge 181 on the lower side of the amplification portion PBG 15 is in the reflection portion PBG 16. Therefore, in a case where the laser oscillation is performed at the lower band edge 181, the light amplified by the 2DPC light-amplification portion 123 cannot exist in the reflection portion PBG 16, and thus, is reflected on the 2DPC light-amplification portion 123 side by the 2DPC light-reflection portion 125, and is further amplified. On the other hand, it can be seen that the energy (lower side in wavelength conversion, that is, 931 nm) of the upper band edge 182 of the amplification portion PBG 15 is on the higher energy side than the reflection portion PBG 16, and in the reflection portion PB. Therefore, the light of the upper band edge 182 cannot be strongly confined in the 2DPC light-amplification portion 123, and when the 2DPC light-amplification portion 123 is small as in Example 1, a feedback action necessary for laser oscillation cannot be obtained, so that laser oscillation is difficult. Therefore, in the two-dimensional photonic-crystal surface-emitting laser of Example 1, laser oscillation occurs only at the lower band edge 181.

Figure 6:
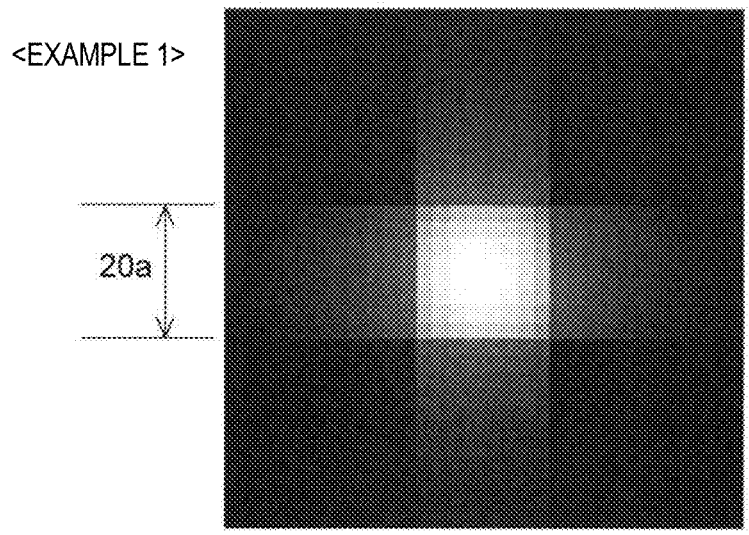
FIG. 6 is a graph illustrating a calculation result of distribution of photons in a photonic-crystal layer in Example 1.
Figure 7:
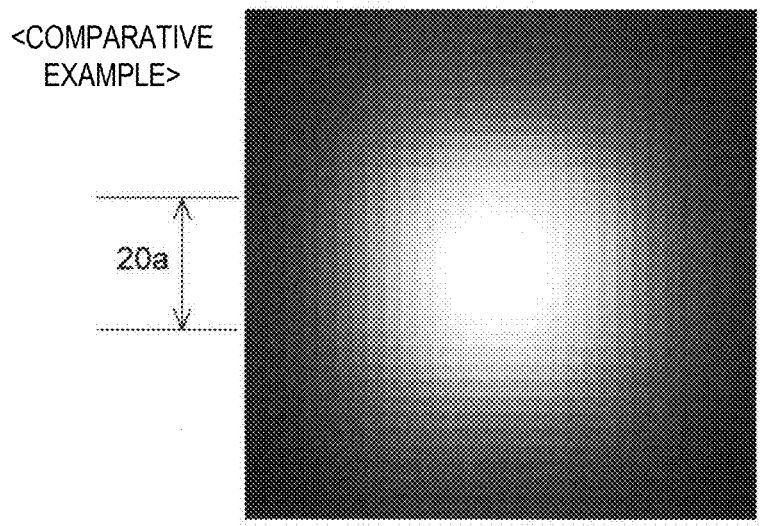
FIG. 7 is a graph illustrating a calculation result of distribution of photons in a photonic-crystal layer in Comparative Example.

In the two-dimensional photonic-crystal surface-emitting laser of Example 1, the distribution of photons in the photonic-crystal layer 12, that is, the distribution of light intensity was obtained by calculation. For comparison, the distribution of photons in the photonic-crystal layer 12 was similarly obtained by calculation also for a two-dimensional photonic-crystal surface-emitting laser ("Comparative Example") in which the second modified refractive-index region 124 was replaced with the first modified refractive-index region 122 in Example 1, that is, all the two-dimensional photonic crystals in the photonic-crystal layer 12 were 2DPC light-amplification portions and did not have a 2DPC light-reflection portion, and the other configuration was the same as that of Example 1. The calculation results are indicated in FIG. 6 for Example 1 and FIG. 7 for Comparative Example. In all of these drawings, the density of photons is the highest at a portion indicated by white in the vicinity of the center of the photonic-crystal layer 12, and the density of gray increases as the distance from the center increases, which indicates that the density of photons decreases. Then, in Comparative Example, the concentration distribution concentrically spreads from the center to the end of the photonic-crystal layer 12, whereas in Example 1, the photons are strongly confined within a square range in which the length of one side in the vicinity of the center is 20a, that is, in the 2DPC light-amplification portion 123.

Figure 8:
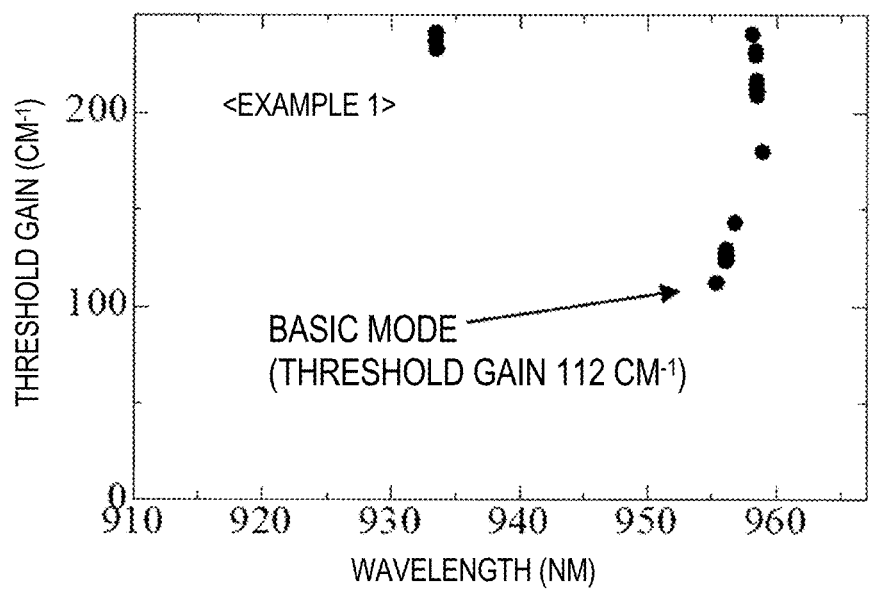
FIG. 8 is a graph illustrating a calculation result of a threshold gain in Example 1.
Figure 9:
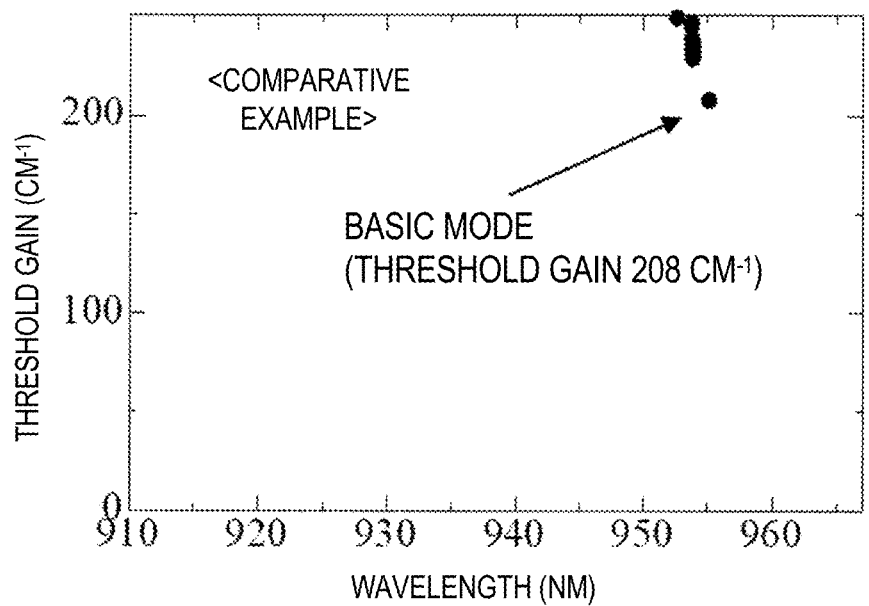
FIG. 9 is a graph illustrating a calculation result of a threshold gain in Comparative Example.
Figure 10:
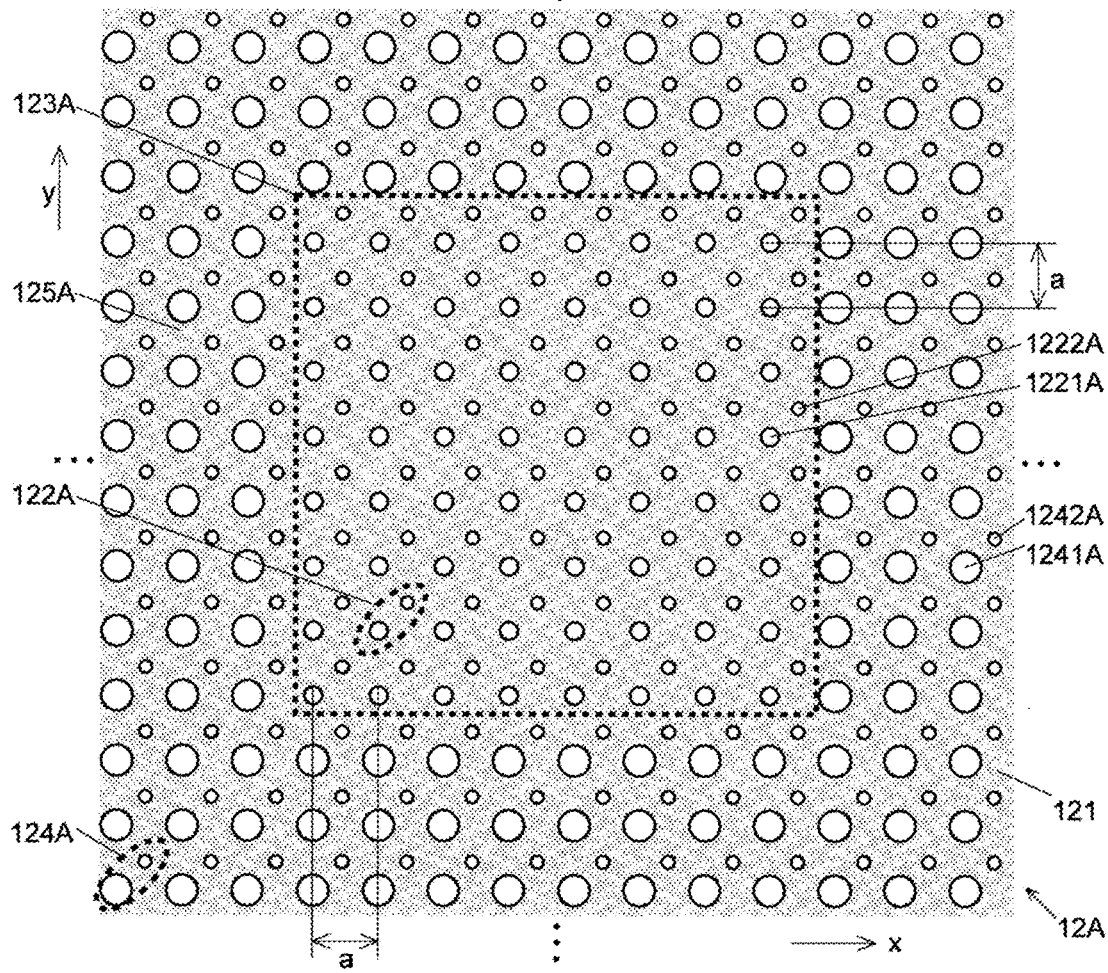
FIG. 10 is a plan view illustrating a configuration of a photonic-crystal layer in the two-dimensional photonic-crystal surface-emitting laser which is Modification of the first embodiment.

Next, for each of the two-dimensional photonic-crystal surface-emitting lasers of Example 1 and Comparative Example, a result obtained by calculating a threshold gain in a case where laser oscillation is performed at the lower band edge 181 will be described. The threshold gain indicates ease of the laser oscillation, and as this value is smaller, stable laser oscillation occurs at a smaller current value. The calculation results are indicated in FIG. 8 for Example 1 and FIG. 9 for Comparative Example. The threshold gain of the basic mode is 112 cm$^{-1}$ in Example 1, whereas it is 208 cm$^{-1}$ in Comparative Example. Therefore, Example 1 has a smaller threshold gain than Comparative Example, and the stable laser oscillation can be obtained.

(1-4) Modification of First Embodiment

A two-dimensional photonic-crystal surface-emitting laser 10A as a modification of the first embodiment will be described. The two-dimensional photonic-crystal surface-emitting laser 10A includes a photonic-crystal layer 12A having a configuration illustrated in a plan view in FIG. 10 instead of the photonic-crystal layer 12 described above. The configuration other than the photonic-crystal layer 12A is similar to that of the two-dimensional photonic-crystal surface-emitting laser 10 of the first embodiment. The photonic-crystal layer 12A includes a plate-shaped base body 121, first modified refractive-index regions 122A arranged in a square lattice shape with the period length a in a square region in the vicinity of the center of the base body 121, and second modified refractive-index regions 124A arranged in a square lattice shape with the period length a outside the square region. The inside of the square region corresponds to a 2DPC light-amplification portion 123A, and the inside of the region where a second modified refractive-index regions 124A are arranged outside the square region corresponds to a 2DPC light-reflection portion 125A. The first modified refractive-index region 122A includes a first main modified refractive-index region 1221A and a first sub-modified refractive-index region 1222A having a smaller FF than that of the first main modified refractive-index region 1221A. In addition, the second modified refractive-index region 124A includes a second main modified refractive-index region 1241A and a second sub-modified refractive-index region 1242A having a smaller FF than that of the second main modified refractive-index region 1241A The volume of the second main modified refractive-index region 1241A is larger than that of the first main modified refractive-index region 1221A (the area is large and the thickness is the same). The second sub-modified refractive-index region 1242A and the first sub-modified refractive-index region 1222A have the same volume (area and thickness). Therefore, the FF of the second modified refractive-index region 124A is larger than that of the first modified refractive-index region 122A. In this FF, the modification is different from the two-dimensional photonic-crystal surface-emitting laser 10 of the first embodiment.

Figure 11:
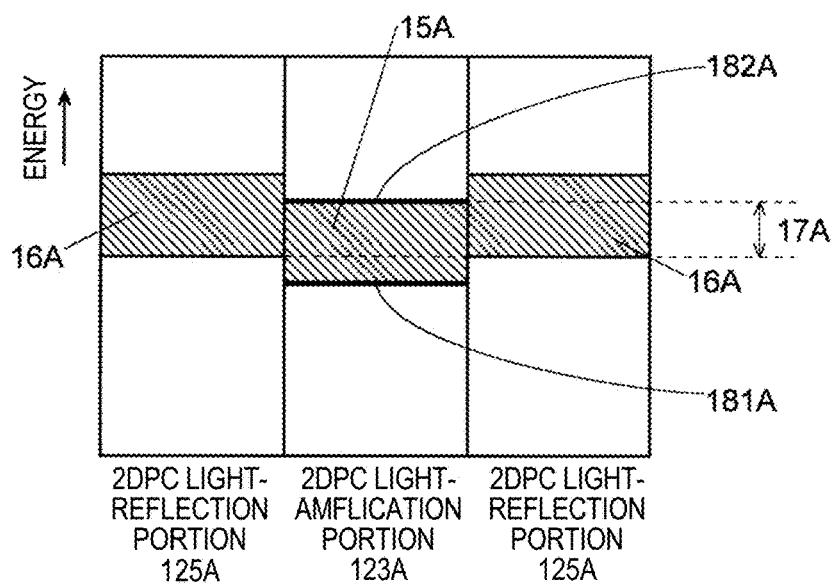
FIG. 11 is a diagram schematically illustrating an amplification portion PBG and a reflection portion PBG according to Modification of the first embodiment.

In the two-dimensional photonic-crystal surface-emitting laser 10A of the modification, FF of the second modified refractive-index region 124A is smaller than FF of the first modified refractive-index region 122A, so that the amplification portion PBG 15A and the reflection portion PBG 16A are formed as follows (FIG. 11). The point that the amplification portion PBG 15A and the reflection portion PBG 16A are both formed between two PBs having a band edge at the point F of the reciprocal lattice space is similar to the two-dimensional photonic-crystal surface-emitting laser 10 of the first embodiment. The reflection portion PBG 16A has substantially the same energy width as the amplification portion PBG 15 and is formed to have higher energy than the amplification portion PBG 15. When the difference between the FFs of the first modified refractive-index region 122A and the second modified refractive-index region 124A is within a certain range, the energy ranges of the amplification portion PBG 15A and the reflection portion PBG 16A partially overlap (overlap range 17A) and are different. In the band edge 181A on the lower side of the amplification portion PBG 15A, the energy is outside the amplification portion PBG 15A (in the reflection portion PB). On the other hand, energy is in the reflection portion PBG 16A at the band edge 182A on the upper side of the amplification portion PBG 15A. Therefore, in a case where the laser oscillation is performed at the upper band edge 182A, the light amplified by the 2DPC light-amplification portion 123A cannot exist in the reflection portion PBG 16A, and thus, is reflected on the 2DPC light-amplification portion 123A side by the 2DPC light-reflection portion 125A, and is further amplified. On the other hand, since the energy of the lower band edge 181A is in the reflection portion PB, the light of the lower band edge 181A cannot be strongly confined in the 2DPC light-amplification portion 123A, and when the 2DPC light-amplification portion 123A is small as in the present modification, a feedback action necessary for laser oscillation cannot be obtained, so that laser oscillation is difficult. Therefore, in the present modification, the laser oscillation occurs only at the upper band edge 182A.

Figure 12:
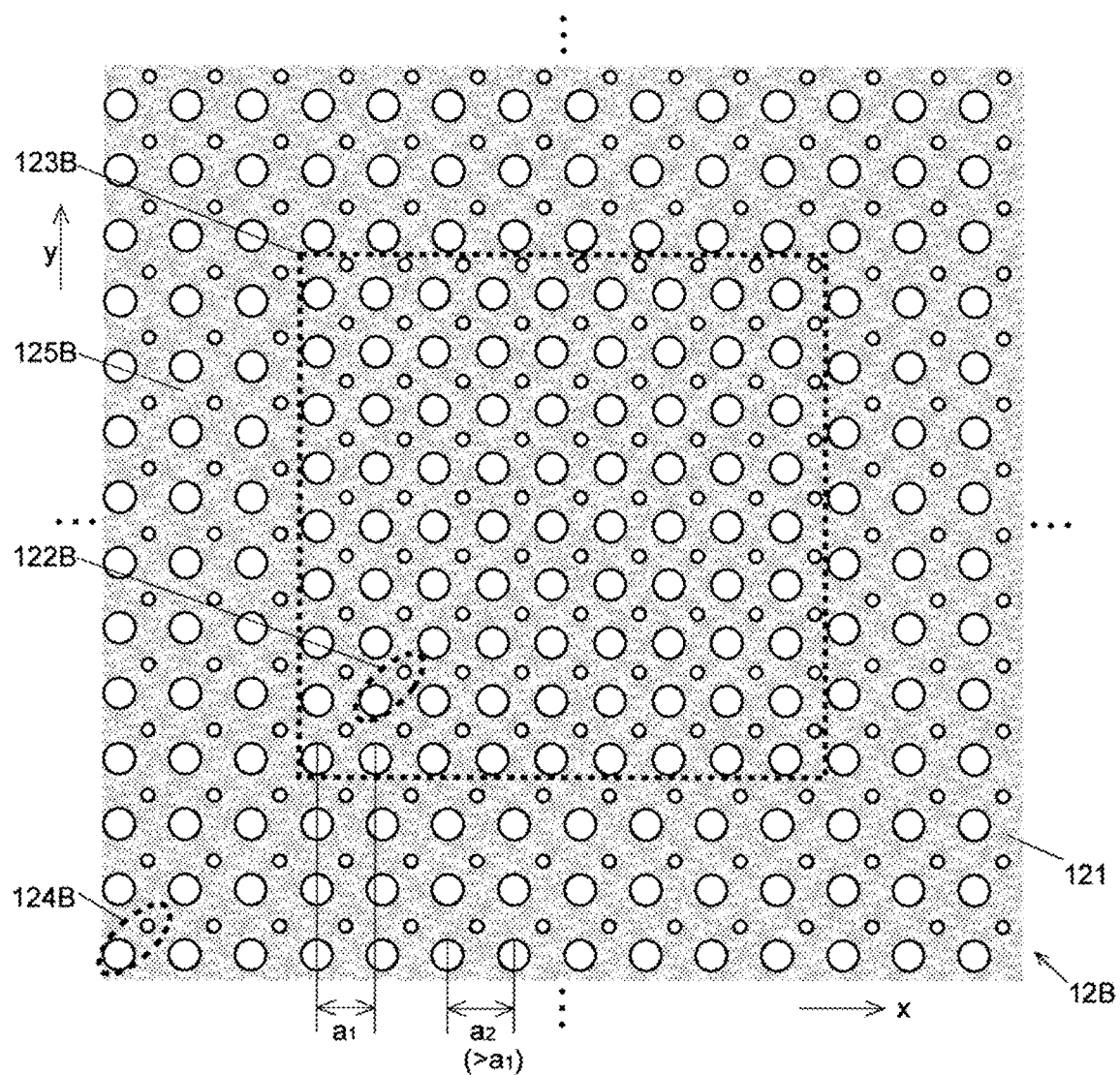
FIG. 12 is a plan view illustrating a configuration of a photonic-crystal layer in the two-dimensional photonic-crystal surface-emitting laser which is another Modification of the first embodiment.

FIG. 12 illustrates a photonic-crystal layer 12B in a two-dimensional photonic-crystal surface-emitting laser 10B according to another modification of the first embodiment. In the two-dimensional photonic-crystal surface-emitting laser 10B of this modification, the configuration other than the photonic-crystal layer 12B is the same as that of the two-dimensional photonic-crystal surface-emitting laser 10 of the first embodiment. The photonic-crystal layer 12B includes a plate-shaped base body 121, first modified refractive-index regions 122B arranged in a square lattice shape with the period length $a_1$ in a square region in the vicinity of the center of the base body 121, and second modified refractive-index regions 124B arranged in a square lattice shape with the period length $a_2$ outside the square region. The square region corresponds to the 2DPC light-amplification portion 123B, and the inside of the region where the second modified refractive-index regions 124B are arranged outside the square region corresponds to the 2DPC light-reflection portion 125B. The period length $a_2$ is longer than $a_1$. The shape and size of the first modified refractive-index region 122B are the same as those of the first modified refractive-index region 122 in the first embodiment. In addition, the shape and size of the second modified refractive-index region 124B are the same as those of the first modified refractive-index region 122B.

Figure 5:
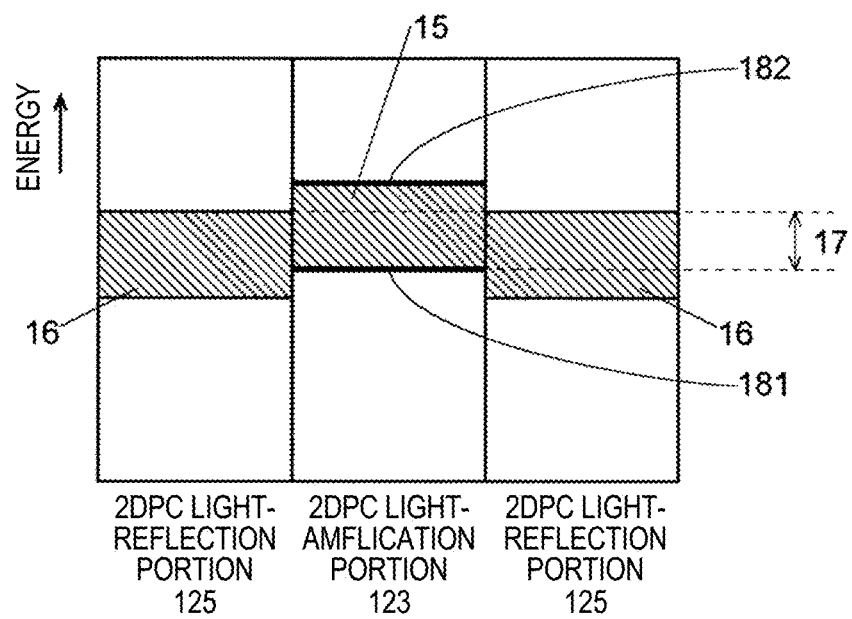
FIG. 5 is a diagram schematically illustrating an amplification portion PBG and a reflection portion PBG in the two-dimensional photonic-crystal surface-emitting laser according to the first embodiment.

In the two-dimensional photonic-crystal surface-emitting laser 10B of this modification, since the period length $a_2$ of the second modified refractive-index regions 122B arranged in the 2DPC light-reflection portion 125B is longer than the period length $a_1$ of the first modified refractive-index regions 124B arranged in the 2DPC light-amplification portion 123B, the reflection portion PBG 16 is formed with lower energy than the amplification portion PBG 15 as illustrated in FIG. 5, similarly to the two-dimensional photonic-crystal surface-emitting laser 10 of the first embodiment. When the difference between the period lengths $a_1$ and $a_2$ is within a certain range, the energy ranges of the amplification portion PBG 15 and the reflection portion PBG 16 partially overlap and are different. As a result, in a case where the light having the wavelength corresponding to the band edge 181 on the lower side of the amplification portion PBG 15 in which the energy is in the amplification portion PBG 15 is introduced from the active layer 11 into the 2DPC light-amplification portion 123B, the light is further amplified since the light is reflected on the 2DPC light-amplification portion 123B side by the 2DPC light-reflection portion 125B. In a case where the light having a wavelength corresponding to the band edge 182 on the upper side of the amplification portion PBG 15 whose energy is outside the amplification portion PBG 15 is introduced from the active layer 11 into the 2DPC light-amplification portion 123B, the light cannot be strongly confined in the 2DPC light-amplification portion 123, and in a case where the 2DPC light-amplification portion 123B is small as in the present modification, a feedback action necessary for the laser oscillation cannot be obtained, so that the laser oscillation is difficult. Therefore, in the present modification, the laser oscillation occurs only at the lower band edge 181.

Figure 13:
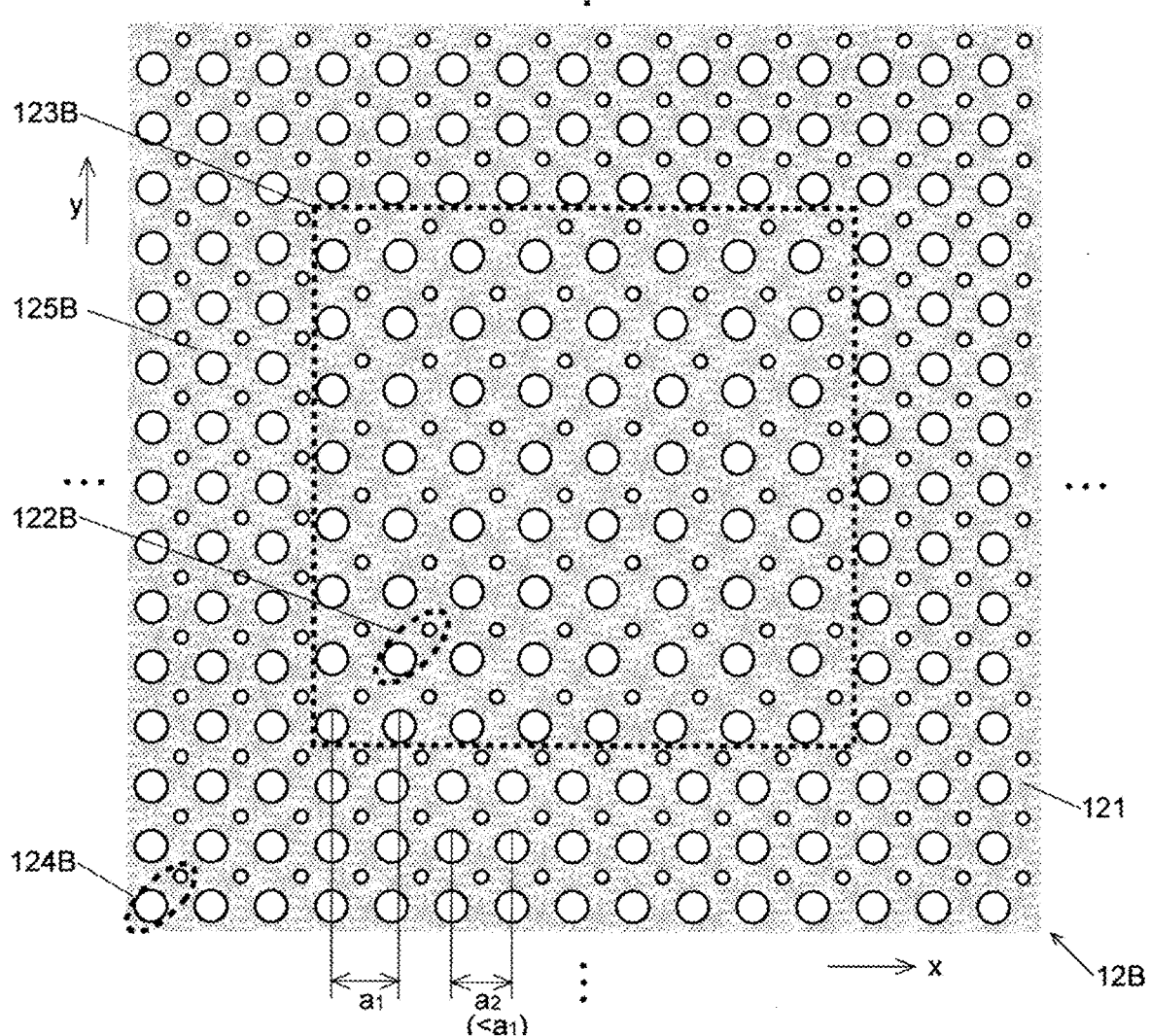
FIG. 13 is a plan view illustrating a configuration of a photonic-crystal layer in the two-dimensional photonic-crystal surface-emitting laser which is still another Modification of the first embodiment.

As illustrated in FIG. 13, in a case where the period length $a_2$ of the second modified refractive-index regions 122B arranged in the 2DPC light-reflection portion 125B is shorter than the period length $a_1$ of the first modified refractive-index regions 124B arranged in the 2DPC light-amplification portion 123B, the reflection portion PBG 16A is formed with higher energy than the amplification portion PBG 15A as illustrated in FIG. 11, similarly to the two-dimensional photonic-crystal surface-emitting laser 10A. According to this configuration, in a case where the light having the wavelength corresponding to the band edge 182A on the upper side of the amplification portion PBG 15A in which the energy is in the amplification portion PBG 15 is introduced from the active layer 11 into the 2DPC light-amplification portion 123B, the light is further amplified since the light is reflected on the 2DPC light-amplification portion 123B side by the 2DPC light-reflection portion 125B. In a case where the light having a wavelength corresponding to the band edge 181A on the lower side of the amplification portion PBG 15A whose energy is outside the amplification portion PBG 15 is introduced from the active layer 11 into the 2DPC light-amplification portion 123B, the light cannot be strongly confined in the 2DPC light-amplification portion 123B, and, when the 2DPC light-amplification portion 123B is small as in the present modification, a feedback action necessary for the laser oscillation cannot be obtained, so that the laser oscillation is difficult.

(2) Second Embodiment (2-1) Configuration and Operation of Two-Dimensional Photonic-Crystal Surface-Emitting Laser of Second Embodiment A two-dimensional photonic-crystal surface-emitting laser 10C of the second embodiment includes a photonic-crystal layer 12C described below instead of the photonic-crystal layer 12 in the two-dimensional photonic-crystal surface-emitting laser 10 of the first embodiment. The configuration other than the photonic-crystal layer 12C is similar to that of the two-dimensional photonic-crystal surface-emitting laser 10 of the first embodiment.

Figure 14:
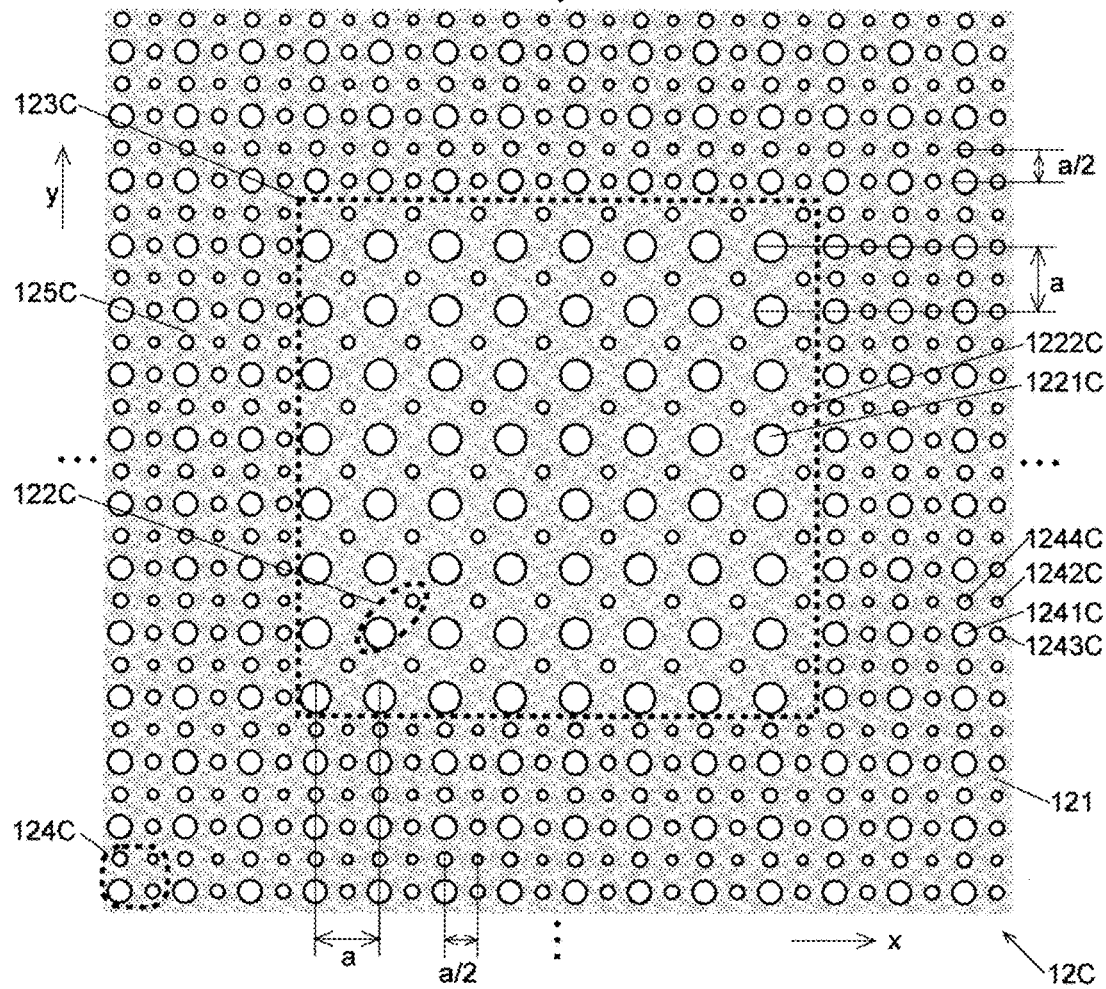
FIG. 14 is a plan view illustrating a configuration of a photonic-crystal layer in a second embodiment of the two-dimensional photonic-crystal surface-emitting laser according to the present invention.

As illustrated in FIG. 14, the photonic-crystal layer 12C includes a plate-shaped base body 121, first modified refractive-index regions 122C in a square lattice pattern in a square region in the vicinity of the center of the base body 121, and second modified refractive-index regions 124C arranged in a square lattice pattern outside the square region. The inside of the square region corresponds to a 2DPC light-amplification portion 123C, and the region where a second modified refractive-index regions 124C are arranged outside the square region corresponds to a 2DPC light-reflection portion 125C. The period length of the square lattice of each of the 2DPC light-amplification portion 123C and the 2DPC light-reflection portion 125C is a.

The first modified refractive-index region 122C has the same configuration as the first modified refractive-index region 122 in the two-dimensional photonic-crystal surface-emitting laser 10 of the first embodiment, and includes a first main modified refractive-index region 1221C and a first sub-modified refractive-index region 1222C.

The second modified refractive-index region 124C includes a second main modified refractive-index region 1241C and three second sub-modified refractive-index regions 1242C, 1243C, and 1244C. The second sub-modified refractive-index region 1242C is disposed at a position shifted by a/2 in the x direction and a/2 in the y direction from the second main modified refractive-index region 1241C. The second sub-modified refractive-index region 1243C is disposed at a position shifted by a/2 in the x direction from the second main modified refractive-index region 1241C (not shifted in the y direction). The second sub-modified refractive-index region 1244C is disposed at a position shifted by a/2 in the y direction from the second main modified refractive-index region 1241C (not shifted in the x direction). These three second sub-modified refractive-index regions 1242C, 1243C, and 1244C have a volume smaller than that of the second main modified refractive-index region 1241C (the area is small and the thickness is the same). In addition, the FFs of the first modified refractive-index region 122C and the second modified refractive-index region 124C are made equal.

Both the first modified refractive-index region 122C and the second modified refractive-index region 124C are formed of holes. Instead of the holes, a member having a refractive index different from that of the base body 121 may be embedded.

Figure 15:
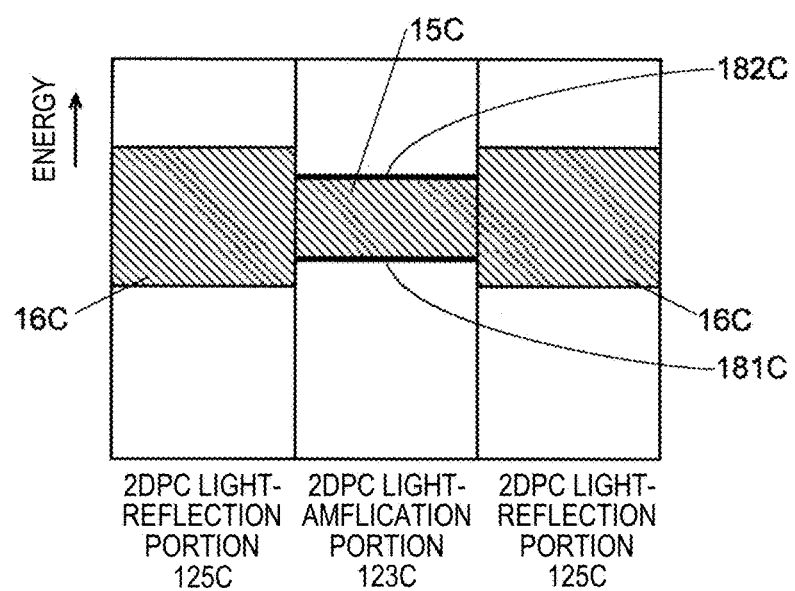
FIG. 15 is a diagram schematically illustrating an amplification portion PBG and a reflection portion PBG in the two-dimensional photonic-crystal surface-emitting laser according to the second embodiment.

As described above, in the 2DPC light-reflection portion 125C of the second embodiment, the second sub-modified refractive-index regions 1242C, 1243C, and 1244C having a volume smaller than that of the second main modified refractive-index region 1241C are arranged between the two adjacent second main modified refractive-index regions 1241C periodically arranged with the period length a in the x direction and the y direction, respectively. As a result, the intensity of light that propagates in the 2DPC light-reflection portion 125C and is diffracted in the 180° direction increases. Then, as illustrated in FIG. 15, the energy width of the reflection portion PBG 16C formed in the 2DPC light-reflection portion 125C is wider than the energy width of the amplification portion PBG 15C formed in the 2DPC light-amplification portion 123C. On the other hand, since the period lengths of the 2DPC light-amplification portion 123C and the 2DPC light-reflection portion 125 are equal to each other and the FFs of the first modified refractive-index region 122C and the second modified refractive-index region 124C are equal to each other, the median value of the energy of the amplification portion PBG 15C is substantially the same as the median value of the energy of the reflection portion PBG 16C. As a result, both the lower band edge 181C and the upper band edge 182C of the amplification portion PBG 15C have energy in the reflection portion PBG 16C. Therefore, in a case where light having a wavelength corresponding to energy of either the lower band edge 181C or the upper band edge 182C is introduced from the active layer 11 into the 2DPC light-amplification portion 123C, the light is further amplified since the light is reflected on the 2DPC light-amplification portion 123C side by the 2DPC light-reflection portion 125C.

(2-2) Simulation of Characteristics of Two-Dimensional Photonic-Crystal Surface-Emitting Laser of Second Embodiment With respect to the two-dimensional photonic-crystal surface-emitting laser 10C of the second embodiment, a result of obtaining characteristics by calculation will be described. In this calculation, 80 modified refractive-index regions are arranged in the x direction and 80 modified refractive-index regions are arranged in the y direction in the photonic-crystal layer 12C, and among the modified refractive-index regions, 20 modified refractive-index regions are arranged in the longitudinal direction and 20 modified refractive-index regions are arranged in the lateral direction in the vicinity of the center, and these modified refractive-index regions are set as the first modified refractive-index region 122C, and the other modified refractive-index regions are set as the second modified refractive-index region 124C. The lattice constant a of the square lattice was 280 nm. The position of the first sub-modified refractive-index region 1222C was shifted from the first main modified refractive-index region 1221C by 0.44a in the x direction and 0.44a in the y direction. FF in the first modified refractive-index region 122C is 0.09 (9%) in the first main modified refractive-index region 1221C, 0.03 (3%) in the first sub-modified refractive-index region 1222C, and 0.12 (12%) as a whole. FF in the second modified refractive-index region 124C is 0.05 (5%) in the second main modified refractive-index region 1241C, and is 0.03 (3%), 0.02 (2%), and 0.02 (2%) in the second sub-modified refractive-index regions 1242C, 1243C, and 1244C, respectively, and is 0.12 (12%) as a whole. The thickness of the photonic-crystal layer 12 was 170 nm, and the distance between the photonic-crystal layer 12 and the active layer 11 was 60 nm. The two-dimensional photonic-crystal surface-emitting laser 10C of the second embodiment having the above parameters is referred to as "Example 2".

In the two-dimensional photonic-crystal surface-emitting laser of Example 2, the effective refractive indexes of both the 2DPC light-amplification portion 123C and the 2DPC light-reflection portion 125C were 3.372. In addition, when a one-dimensional coupling coefficient, which is an index corresponding to the intensity of light propagated through the two-dimensional photonic crystal and diffracted in the 180° direction, was obtained by calculation, the one-dimensional coupling coefficient was 2630 $cm^{-1}$ in the 2DPC light-amplification portion 123C, whereas the one-dimensional coupling coefficient was 3973 $cm^{-1}$ in the 2DPC light-reflection portion 125C, which is a value higher than that of the 2DPC light-amplification portion 123C. This indicates that the intensity of light diffracted in the 180° direction is higher and the PBG is larger in the 2DPC light-reflection portion 125C than in the 2DPC light-amplification portion 123C.

The energy range of the PBG was calculated to be 931 to 951 nm in terms of wavelength in vacuum in the amplification portion PBG 15C, and 924 to 956 nm in terms of wavelength in vacuum in the reflection portion PBG 16C. Therefore, it can be seen that both the lower band edge 181C and the upper band edge 182C of the amplification portion PBG 15C are in the reflection portion PBG 16C. Therefore, even when the laser oscillation is performed with the energy of either of the band edges 181C and 182C, the light amplified by the 2DPC light-amplification portion 123C cannot exist in the reflection portion PBG 16C, and thus, is reflected on the 2DPC light-amplification portion 123C side by the 2DPC light-reflection portion 125C, and is further amplified.

Figure 16:
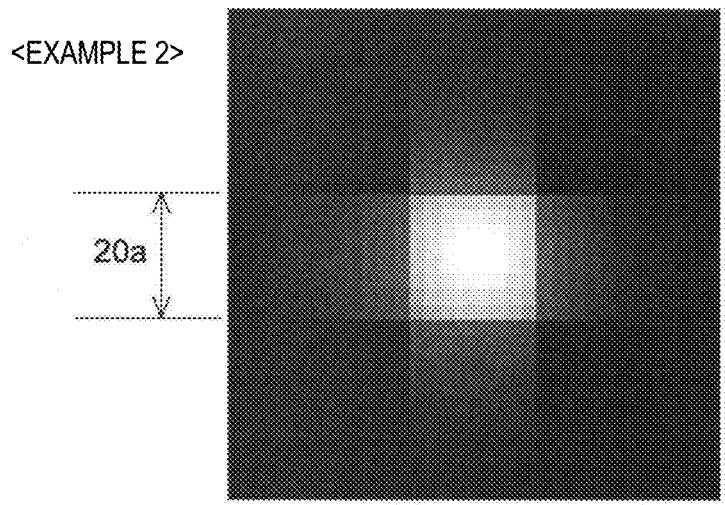
FIG. 16 is a graph illustrating a calculation result of distribution of photons in a photonic-crystal layer in Example 2.

In the two-dimensional photonic-crystal surface-emitting laser of Example 2, the distribution of photons in the photonic-crystal layer 12C was obtained by calculation, and as a result, similarly to the Example 1 (FIG. 6), a result indicating that photons are strongly confined within a square range in which the length of one side in the vicinity of the center is 20a, that is, in the 2DPC light-amplification portion 123, was obtained (FIG. 16).

Figure 17:
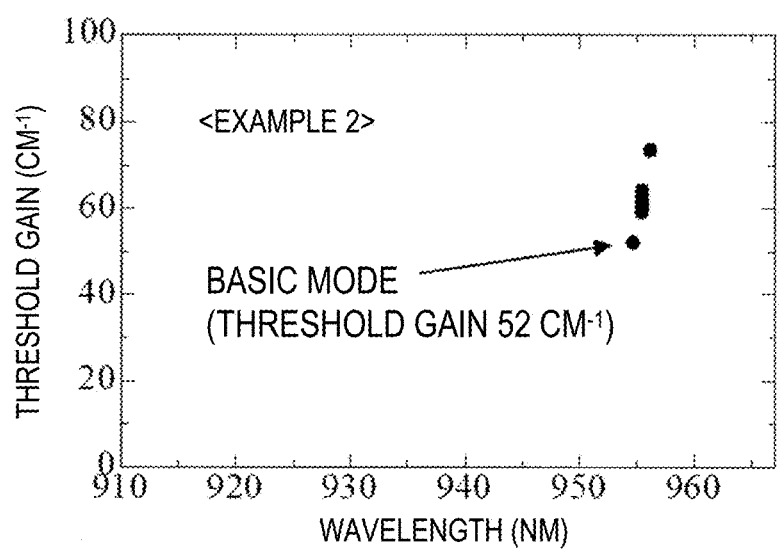
FIG. 17 is a graph illustrating a calculation result of a threshold gain in Example 2.

In the two-dimensional photonic-crystal surface-emitting laser of Example 2, the threshold gain in the case of the laser oscillation at the lower band edge 181C was obtained by calculation, and as illustrated in FIG. 17, the threshold gain of the basic mode was 52 $cm^{-1}$. This threshold gain is smaller than those of Comparative Example (FIG. 9) and Example 1 (FIG. 8), indicating that the two-dimensional photonic-crystal surface-emitting laser of Example 2 can obtain stable laser oscillation with a smaller current.

(2-3) Modification of Second Embodiment

Figure 18:
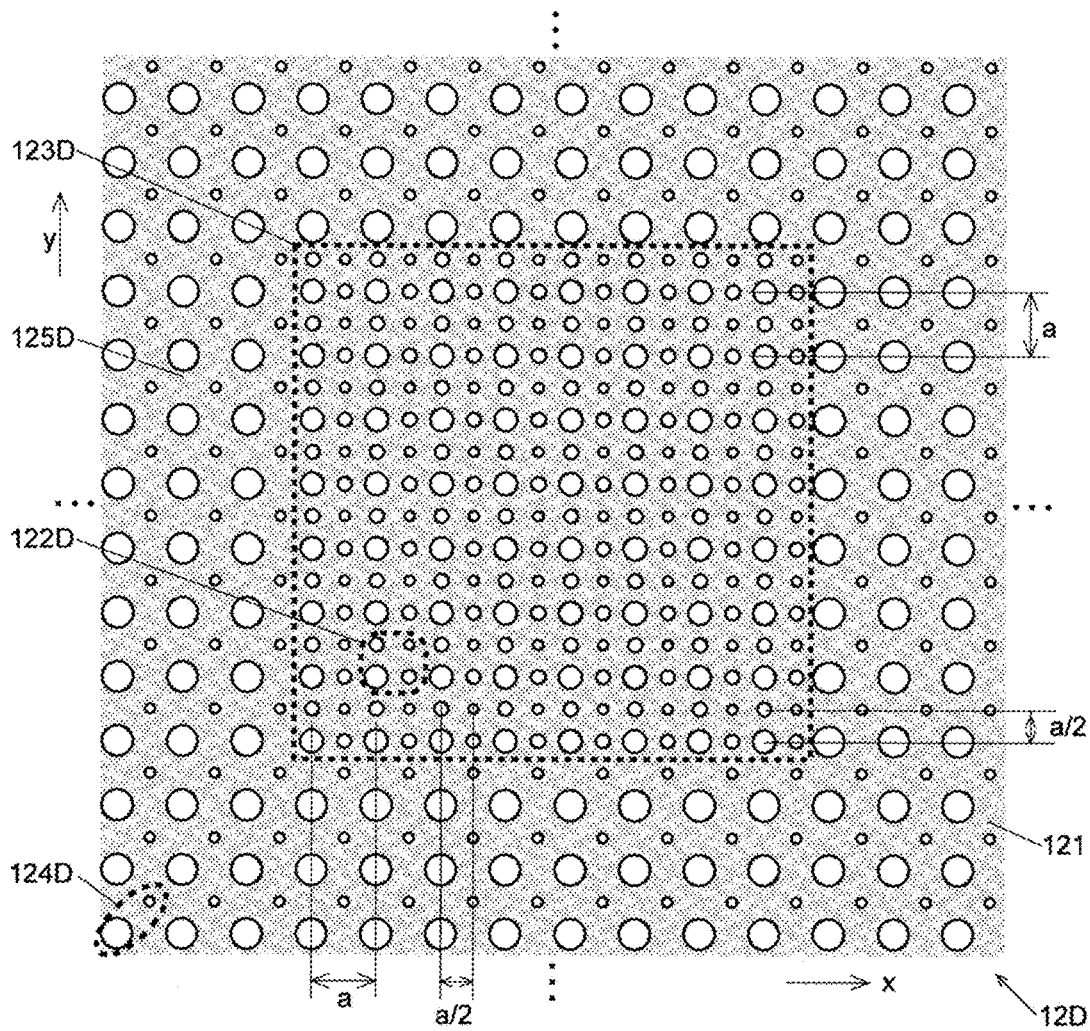
FIG. 18 is a plan view illustrating a configuration of a photonic-crystal layer in the two-dimensional photonic-crystal surface-emitting laser which is Modification of the second embodiment.

A two-dimensional photonic-crystal surface-emitting laser 10D as a modification of the second embodiment will be described. In the two-dimensional photonic-crystal surface-emitting laser 10D, as illustrated in FIG. 18, the photonic-crystal layer 12D has a configuration corresponding to a configuration in which the shape of the first modified refractive-index region 122C and the shape of the second modified refractive-index region 124C in the two-dimensional photonic-crystal surface-emitting laser 10C of the second embodiment are interchanged. Other configurations are similar to those of the two-dimensional photonic-crystal surface-emitting laser 10C of the second embodiment. In the present modification, the first modified refractive-index region is denoted by a reference numeral 122D, and the second modified refractive-index region is denoted by a reference numeral 124D. Furthermore, the 2DPC light-amplification portion is denoted by a reference numeral 123D, and the 2DPC light-reflection portion is denoted by a reference numeral 125D.

Figure 19:
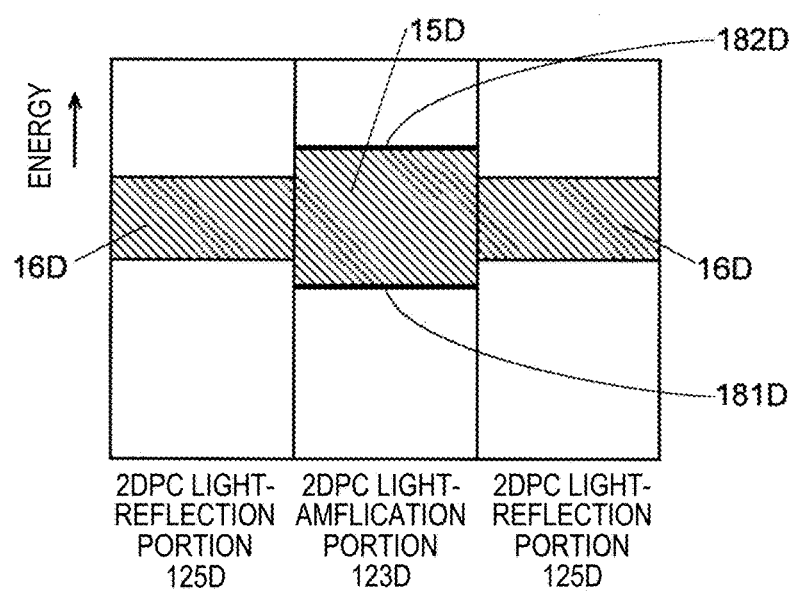
FIG. 19 is a diagram schematically illustrating an amplification portion PBG and a reflection portion PBG according to Modification of the second embodiment.
Figure 20:
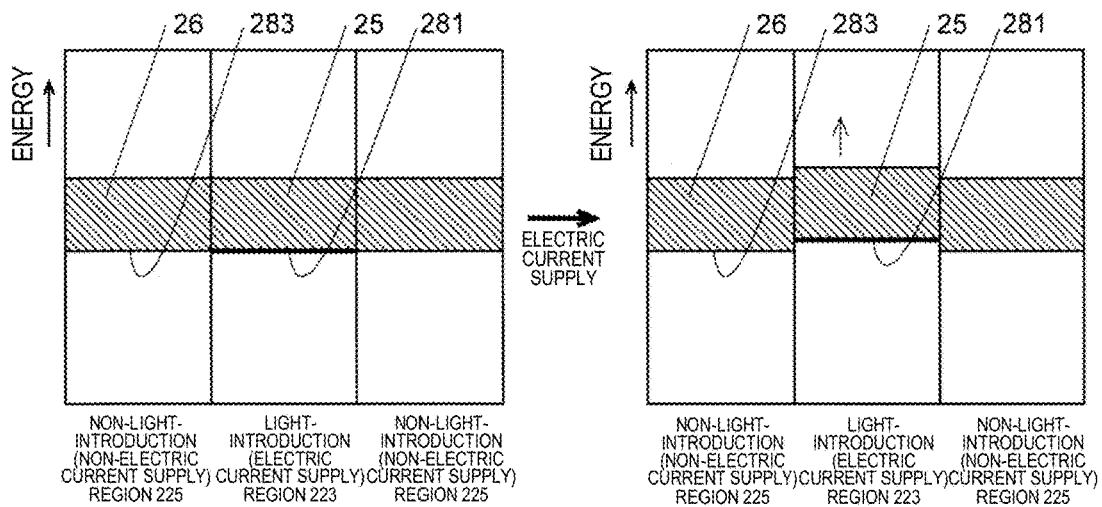
FIG. 20 is a diagram schematically illustrating an amplification portion PBG and a reflection portion PBG before an electric current is supplied into a photonic-crystal layer (left diagram) and after the electric current is supplied into the photonic-crystal layer (right diagram) in a two-dimensional photonic-crystal surface-emitting laser in the related art.

In the two-dimensional photonic-crystal surface-emitting laser 10D of the present modification, as illustrated in FIG. 19, the energy width of the amplification portion PBG 15D formed in the 2DPC light-amplification portion 123D is wider than the energy width of the reflection portion PBG 16D formed in the 2DPC light-reflection portion 125D. In addition, the median value of the energy of the amplification portion PBG 15D is substantially the same as the median value of the energy of the reflection portion PBG 16D. As a result, both the lower band edge 181D and the upper band edge 182D of the amplification portion PBG 15D have energy outside the reflection portion PBG 16C. Therefore, in a case where light having a wavelength corresponding to energy of either the lower band edge 181D or the upper band edge 182D is introduced from the active layer 11 into the 2DPC light-amplification portion 123D, the light enters the 2DPC light-reflection portion 125D and is gently reflected, so that a stable laser beam is emitted from a wide area in the 2DPC light-amplification portion 123D.

(3) Third Embodiment

In the first and second embodiments, in a case where the 2DPC light-amplification portion is small, an example has been described in which light amplified in the 2DPC light-amplification portion is strongly reflected on the 2DPC light-reflection portion using the difference in the energy range between the amplification portion PBG and the reflection portion PBG. In the third embodiment, in a case where the 2DPC light-amplification portion is large, it is considered that light is made to enter the 2DPC light-reflection portion from the 2DPC light-amplification portion to weaken the reflection intensity by using the difference in the energy range between the amplification portion PBG and the reflection portion PBG.

In the two-dimensional photonic-crystal surface-emitting laser in the related art, since the electric current supply region in the active layer is smaller than that in the two-dimensional photonic-crystal formed in the photonic-crystal layer, light generated in the active layer is introduced into only a part of the two-dimensional photonic crystal. Then, the refractive index of the light-introduction region (electric current supply region) 223 of the two-dimensional photonic crystal decreases as the carrier density increases, and the energies of PB and PBG become slightly higher as a whole than that of the surrounding region ("non-light-introduction region (non-electric current supply region) 225"). As a result, the energy of the lower band edge 281 of the PBG 25 in the light-introduction region 223 has the same value as the energy of the lower band edge 283 of the PBG 26 in the non-light-introduction region 225 before the electric current is supplied into the light-introduction region 223 (left diagram of FIG. 20), whereas when the electric current is supplied, a value slightly inside the PBG 26 in the non-light-introduction region 225 (right diagram of FIG. 20) is obtained. As a result, the light having the wavelength corresponding to the energy of the band edge 281 is unintentionally strongly reflected on the light-introduction region 223 side at the boundary with the non-light-introduction region 225. Then, the feedback action of light becomes stronger than necessary, and when the area of the two-dimensional photonic crystal is large, laser oscillation in a plurality of oscillation modes occurs.

Figure 21:
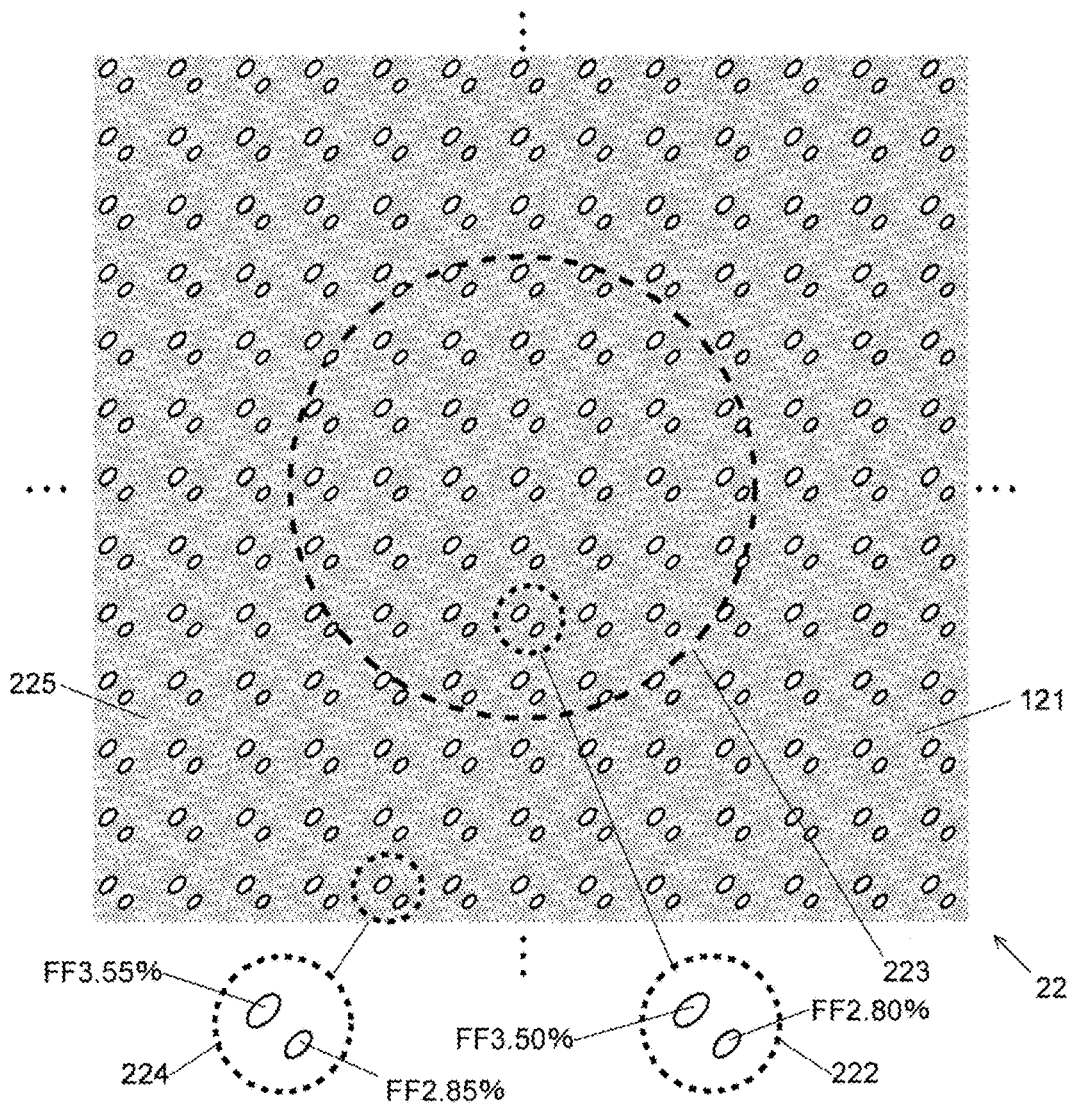
FIG. 21 is a plan view illustrating a configuration of a photonic-crystal layer in a third embodiment of the two-dimensional photonic-crystal surface-emitting laser according to the present invention.

Therefore, as illustrated in FIG. 21, in the third embodiment, in the photonic-crystal layer 22, the volume of the modified refractive-index region 224 provided in the non-light-introduction region 225 is made slightly larger (the area is large and the thickness is the same) than the volume of the modified refractive-index region 222 provided in the light-introduction region 223.

Figure 22:
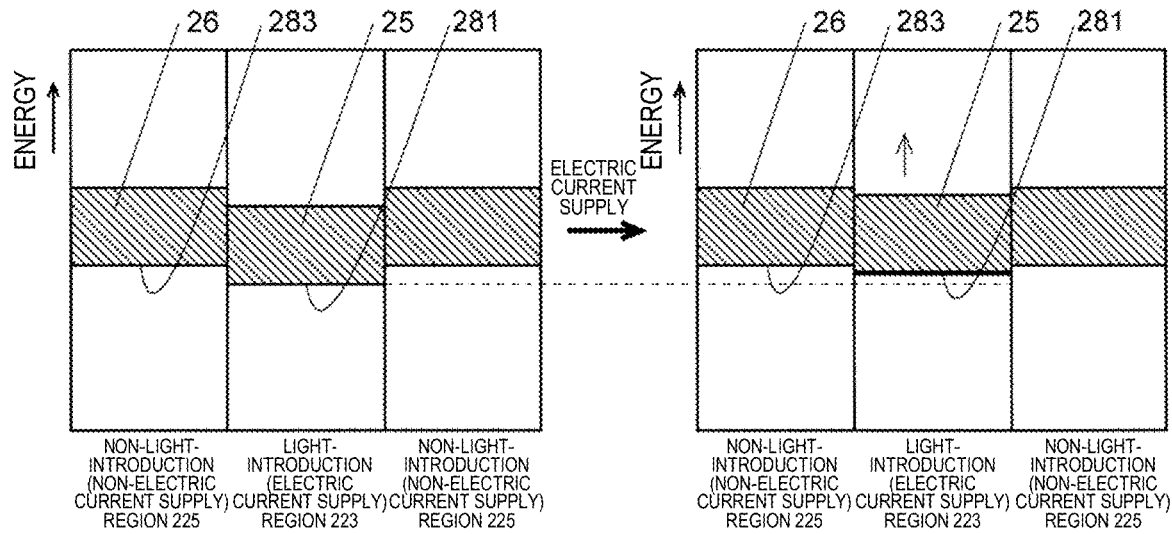
FIG. 22 is a diagram schematically illustrating an amplification portion PBG and a reflection portion PBG before an electric current is supplied into a photonic-crystal layer (left diagram) and after the electric current is supplied into the photonic-crystal layer (right diagram) in a two-dimensional photonic-crystal surface-emitting laser of the third embodiment.

As a result, the energy of the lower band edge 281 of the PBG 25 in the light-introduction region 223 becomes lower than the energy of the lower band edge 283 of the PBG 26 in the non-light-introduction region 225 before the electric current is supplied into the light-introduction region 223 (left diagram of FIG. 22). When the electric current is supplied, the energy of the band edge 281 increases and approaches the energy of the band edge 283 (the right diagram of FIG. 22); however, by appropriately setting the difference in volume between the modified refractive-index region 222 and the modified refractive-index region 224, a state in which the energy of the band edge 281 does not exceed the energy of the band edge 283 can be maintained. As a result, the energy of the band edge 281 enters PB of the non-light-introduction region 225, and thus, the light having the oscillation wavelength corresponding to the energy of the band edge 281 is gently reflected on the light-introduction region 223 side while spreading in the non-light-introduction region 225. Therefore, a standing wave in a higher mode in which an antinode of an electric field exists in the vicinity of the end of the light-introduction region 223 is less likely to occur, and even when the area of the light-introduction region 223 is large, a stable laser beam in a single oscillation mode can be emitted.

Figure 23:
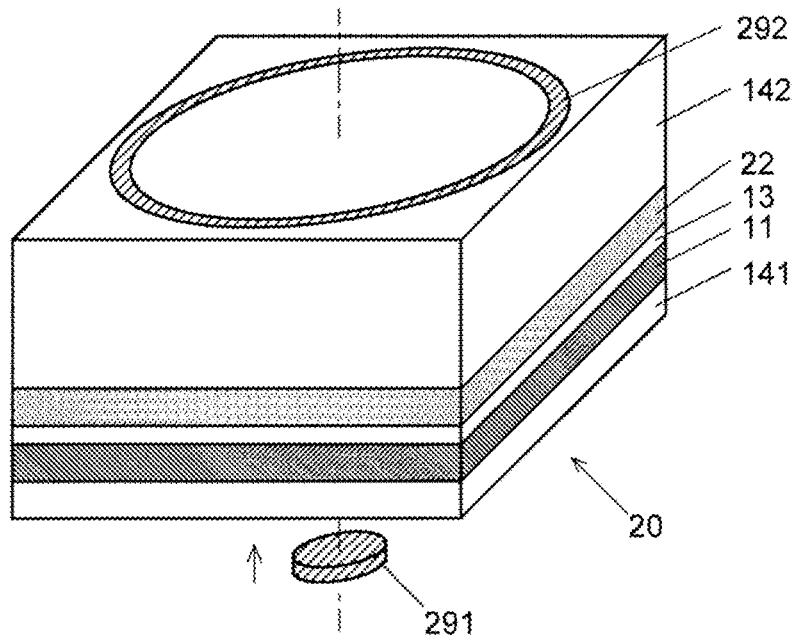
FIG. 23 is a perspective view illustrating a two-dimensional photonic-crystal surface-emitting laser according to the third embodiment.

In the example illustrated in FIG. 21, for each of the modified refractive-index regions 222 and 224, one having a planar shape including two ellipses having different areas is used. In the modified refractive-index region 222, the FFs of the two ellipses were 3.50% and 2.80% (6.30% in total), respectively, and in the modified refractive-index region 224, the FFs of the two ellipses were 3.55% and 2.85% (6.40% in total), respectively. In the example illustrated in FIG. 21, the light-introduction region 223 is circular. As illustrated in FIG. 23, such a circular light-introduction region is realized by making a first electrode 291 and a second electrode 292 circular. Except for the configurations of the photonic-crystal layer 22, the first electrode 291, and the second electrode 282, a two-dimensional photonic-crystal surface-emitting laser 20 of the third embodiment has the same configuration as that of the two-dimensional photonic-crystal surface-emitting laser 10 of the first embodiment.

Figure 24:
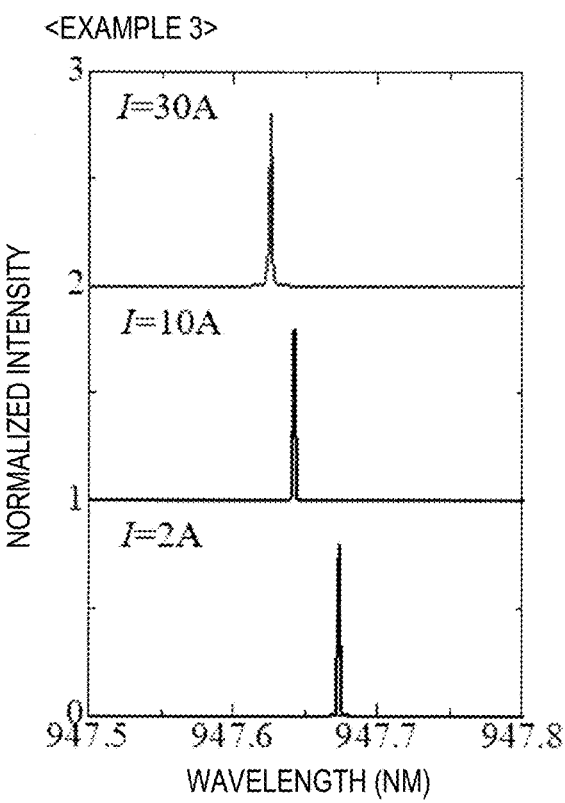
FIG. 24 is a diagram illustrating a result obtained by calculating an oscillation spectrum of the laser beam in a two-dimensional photonic-crystal surface-emitting laser of Example 3.
Figure 25:
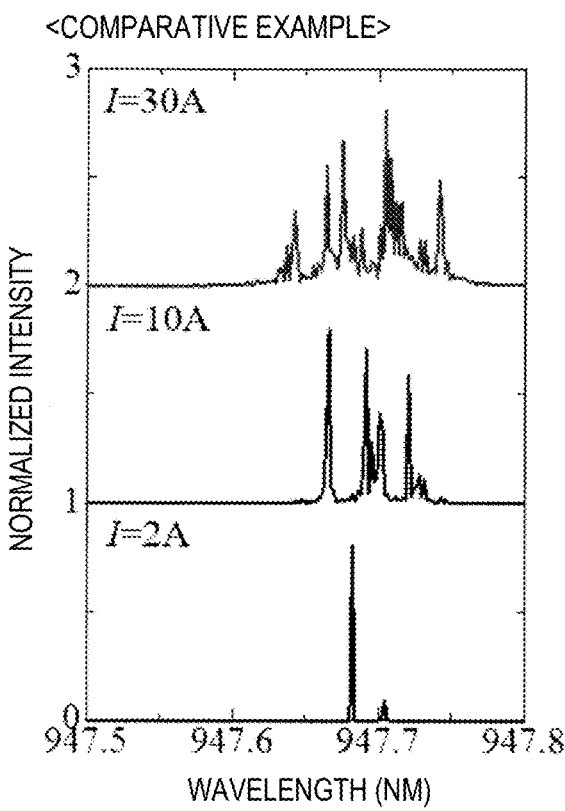
FIG. 25 is a diagram illustrating a result obtained by calculating an oscillation spectrum of the laser beam in a two-dimensional photonic-crystal surface-emitting laser of Comparative Example.

For the two-dimensional photonic-crystal surface-emitting laser 20 of the third embodiment, the spectrum of the oscillating laser beam was obtained by calculation (Example 3). In Example 3, a diameter of the light-introduction region 223 is set to 500 µm. As Comparative Example, calculation similar to that of Example 3 was also performed for a case where the modified refractive-index region 222 having the same shape and size as those of the light-introduction region 223 in Example 3 was arranged in the entire photonic-crystal layer with the same period length as that of Example 3. The calculation results are indicated in FIG. 24 for Example 3 and FIG. 25 for Comparative Example. In either case, the spectrum varies depending on the value ("I=2 (or 10, 30) A" in the figure) of the electric current supplied into the active layer. However, in any current value, laser oscillation occurs at a plurality of wavelengths in Comparative Example, whereas laser oscillation occurs only at a single wavelength in Example 3. That is, in Example 3, a laser beam in a single oscillation mode can be emitted.

Figure 26:
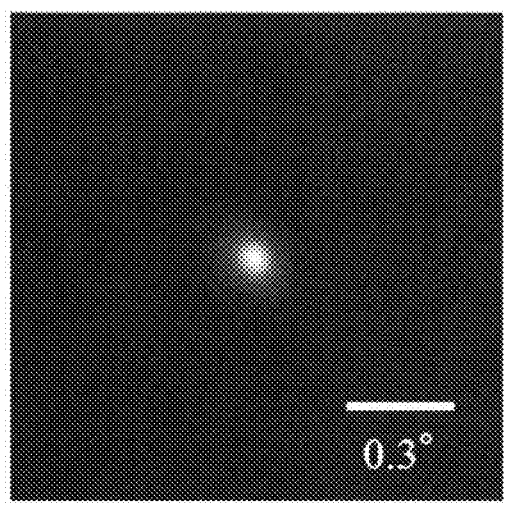
FIG. 26 is a diagram illustrating a result obtained by calculating a far-field image of a laser beam in a two-dimensional photonic-crystal surface-emitting laser of Example 3.
Figure 27:
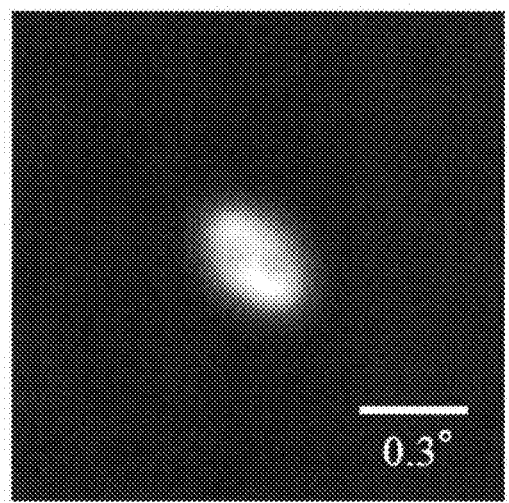
FIG. 27 is a view illustrating a result obtained by calculating a far-field image of a laser beam in a two-dimensional photonic-crystal surface-emitting laser of Comparative Example.
Figure 28:
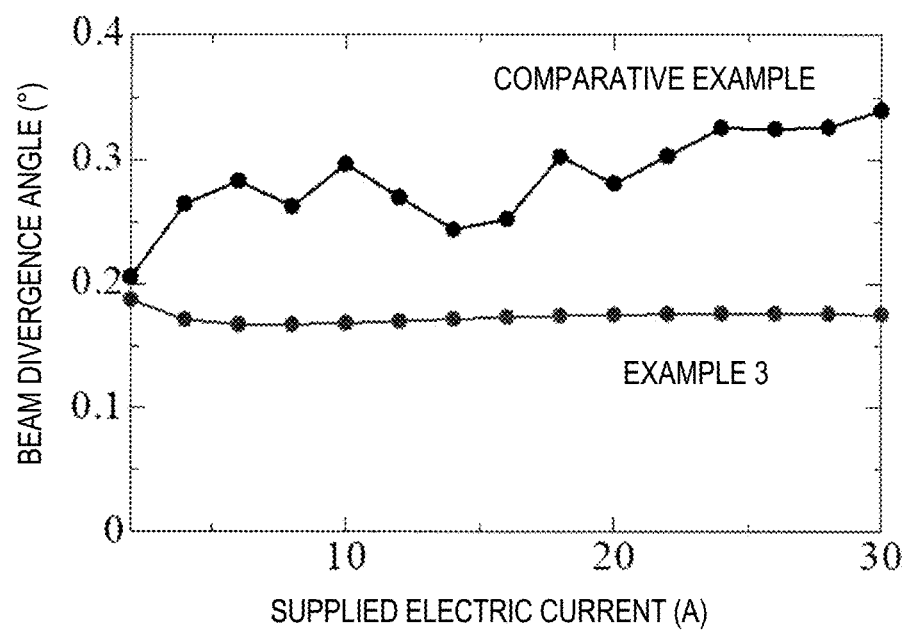
FIG. 28 is a view illustrating a result obtained by calculating a divergence angle of a laser beam in two-dimensional photonic-crystal surface-emitting lasers of Example 3 and Comparative Example.

Next, the results obtained by calculating far-field images of the laser beams are illustrated in FIG. 26 for Example 3 and FIG. 27 for Comparative Example. The spread of the laser beam is smaller in Example 3 than in Comparative Example. Further, as a result of calculating the divergence angle of the beam, as illustrated in FIG. 28, the divergence angle of Example 3 is smaller than that of Comparative Example regardless of the value of the electric current supplied into the active layer. From these results, it can be said that in Example 3, a smaller region can be intensively irradiated with the laser beam than in Comparative Example.

The embodiments of the present invention have been described above, but the present invention is not limited to the above embodiments and various modifications are possible.

For example, in the above embodiment, for one modified refractive-index region, a combination of two or more holes and other regions having a refractive index different from that of the base body (main refractive index region and sub-refractive index region) is used, but only one region having a refractive index different from that of the base body may be used. In that case, it is desirable that the planar shape of one region having a refractive index different from that of the base body is non-circular (for example, an elliptical shape, a triangular shape, or the like), and the region may be circular.

The 2DPC light-reflection portion is provided on the entire periphery of the 2DPC light-amplification portion in the above embodiment, and may be provided only on a part of the periphery of the 2DPC light-amplification portion. However, in order to achieve a higher effect, it is preferable to provide the 2DPC light-reflection portions on the entire periphery of the 2DPC light-amplification portion as in the above embodiment.

In the first embodiment, the FF of the modified refractive-index region is made different between the 2DPC light-amplification portion and the 2DPC light-reflection portion, and in the modification of the first embodiment, the period length is made different between the 2DPC light-amplification portion and the 2DPC light-reflection portion. However, both the FF and the period length may be made different between the 2DPC light-amplification portion and the 2DPC light-reflection portion. In the second embodiment and Modification thereof, the FF and the period length of the modified refractive-index region are the same values between the 2DPC light-amplification portion and the 2DPC light-reflection portion, and the FF and/or the period length may be different values between the 2DPC light-amplification portion and the 2DPC light-reflection portion. In the third embodiment and Modification thereof, the FF of the modified refractive-index region is different between the 2DPC light-amplification portion and the 2DPC light-reflection portion, and only the period length or both the FF and the period length may be different.

REFERENCE SIGNS LIST 10, 10A, 10B, 10C, 10D, 20 . . . Two-Dimensional Photonic-Crystal Surface-Emitting Laser
11 . . . Active Layer
111 . . . Current Supply Region
12, 12A, 12B, 12C, 12D, 22 . . . Photonic-Crystal Layer
1201, 223 . . . Light-Introduction Region
121 . . . Base Body
122, 122A, 122B, 122C, 122D . . . First Modified Refractive-Index Region
1221, 1221A, 1221C . . . First Main Modified Refractive-Index Region
1222, 1222A, 1222C . . . First Sub-Modified Refractive-Index Region
123, 123A, 123B, 123C, 123D . . . 2DPC Light-Amplification Portion
124, 124A, 124B, 124C, 124D . . . Second Modified Refractive-Index Region
1241, 1241A, 1241C . . . Second Main Modified Refractive-Index Region
1242, 1242A, 1242C, 1243C, 1244C . . . Second Sub-Modified Refractive-Index Region
125, 125A, 125B, 125C, 125D . . . 2DPC Light-Reflection Portion
13 . . . Spacer Layer
141 . . . First Cladding Layer
142 . . . Second Cladding Layer
15, 15A, 15C, 15D . . . Amplification Portion PBG
16, 16A, 16C, 16D . . . Reflection Portion PBG
17, 17A . . . Overlapping Range of Amplification Portion PBG and Reflection Portion PBG
181, 181A, 181C, 181D, 182, 182A, 182C, 182D, 281, 283 . . . Band Edge
191, 291 . . . First Electrode
192, 292 . . . Second Electrode
1921 . . . Window Portion
1922 . . . Frame Portion
222, 224 . . . Modified Refractive-Index Region
225 . . . Non-Light-Introduction Region
25 . . . PBG in Light-Introduction Region
26 . . . PBG in Non-Light-Introduction Region

The invention claimed is:

1. A two-dimensional photonic-crystal surface-emitting laser comprising:
 a) an active layer configured to emit light by supplying an electric current; and
 b) a photonic-crystal layer including
  b-1) a two-dimensional photonic-crystal light-amplification portion that is a first two-dimensional photonic-crystal region provided, for introducing the light emitted from the active layer, in a plate-shaped base body disposed on one side of the active layer, and includes an amplification-portion photonic band gap which is a photonic band gap formed between two photonic bands having a band edge at a predetermined point in a reciprocal lattice space, and
  b-2) a two-dimensional photonic-crystal light-reflection portion that is a second two-dimensional photonic-crystal region provided around the two-dimensional photonic-crystal light-amplification portion, and includes a reflection-portion photonic band gap which is a photonic band gap formed between two photonic bands having a band edge at the predetermined point of the reciprocal lattice space, wherein energy ranges of the amplification-portion photonic band gap and the reflection-portion photonic band gap partially overlap and are different, and wherein, when the electric current is supplied into the two-dimensional photonic-crystal light-amplification portion, an energy of a lower band edge of the amplification-portion photonic band gap does not exceed an energy of a lower band edge of the reflection-portion photonic band gap.

2. The two-dimensional photonic-crystal surface-emitting laser according to claim 1, wherein in the two-dimensional photonic-crystal light-amplification portion and the two-dimensional photonic-crystal light-reflection portion, modified refractive-index regions having a refractive index different from that of the base body are periodically and two-dimensionally arranged, and a ratio of a volume occupied by the modified refractive-index regions in the two-dimensional photonic-crystal light-amplification portion is different from a ratio of a volume occupied by the modified refractive-index regions in the two-dimensional photonic-crystal light-reflection portion.

3. The two-dimensional photonic-crystal surface-emitting laser according to claim 1, wherein in the two-dimensional photonic-crystal light-amplification portion and the two-dimensional photonic-crystal light-reflection portion, modified refractive-index regions having a refractive index different from that of the base body are periodically and two-dimensionally arranged, and a period length in which the modified refractive-index regions are arranged in the two-dimensional photonic-crystal light-amplification portion is different from a period length in which the modified refractive-index regions are arranged in the two-dimensional photonic-crystal light-reflection portion.

4. The two-dimensional photonic-crystal surface-emitting laser according to claim 1, wherein in the two-dimensional photonic-crystal light-amplification portion, modified refractive-index regions having a refractive index different from that of the base body are arranged with a first predetermined period length, and in the two-dimensional photonic-crystal light-reflection portion, main modified refractive-index regions having a refractive index different from that of the base body are arranged with a second predetermined period length, and sub-modified refractive-index regions each having a volume smaller than that of each of the main modified refractive-index regions and a refractive index different from that of the base body are arranged between two most adjacent main modified refractive-index regions.

5. The two-dimensional photonic-crystal surface-emitting laser according to claim 1, wherein in the two-dimensional photonic-crystal light-reflection portion, modified refractive-index regions having a refractive index different from that of the base body are arranged with a first predetermined period length, and in the two-dimensional photonic-crystal light-amplification portion, main modified refractive-index regions having a refractive index different from that of the base body are arranged with a second predetermined period length, and sub-modified refractive-index regions each having a volume smaller than that of each of the main modified refractive-index regions and a refractive index different from that of the base body are arranged between two most adjacent main modified refractive-index regions.

6. The two-dimensional photonic-crystal surface-emitting laser according to claim 1, wherein the two-dimensional photonic-crystal light-amplification portion is included in a light-introduction region in which light emitted in the active layer is introduced into the photonic-crystal layer.

7. The two-dimensional photonic-crystal surface-emitting laser according to claim 1, wherein in the two-dimensional photonic-crystal light-amplification portion, the modified refractive-index regions having a refractive index different from that of the base body and each having a non-circular planar shape are periodically and two-dimensionally arranged.

* * * * *